(12) United States Patent
Kamino et al.

(10) Patent No.: US 10,504,950 B2
(45) Date of Patent: Dec. 10, 2019

(54) SOLID-STATE IMAGING DEVICE AND ITS MANUFACTURING METHOD

(71) Applicant: Renesas Electronics Corporation, Koutou-ku, Tokyo (JP)

(72) Inventors: Takeshi Kamino, Ibaraki (JP); Fumitoshi Takahashi, Ibaraki (JP); Yotaro Goto, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/924,171

(22) Filed: Mar. 16, 2018

(65) Prior Publication Data

US 2018/0358394 A1    Dec. 13, 2018

(30) Foreign Application Priority Data

Jun. 8, 2017    (JP) .................................. 2017-113764

(51) Int. Cl.
*H01L 27/146*    (2006.01)
*H01L 29/40*    (2006.01)

(52) U.S. Cl.
CPC .. *H01L 27/14612* (2013.01); *H01L 27/14689* (2013.01); *H01L 29/401* (2013.01)

(58) Field of Classification Search
CPC ......... H01L 27/14612; H01L 27/14689; H01L 29/401; H01L 27/14643–14663; H01L 27/146–14893; H01L 27/14603–14616
See application file for complete search history.

(56) References Cited

U.S. PATENT DOCUMENTS

| 2014/0357028 | A1* | 12/2014 | Sassiat | H01L 21/823807 438/217 |
| 2015/0123178 | A1* | 5/2015 | Nishida | H01L 27/14614 257/292 |
| 2015/0221694 | A1* | 8/2015 | Baba | H01L 27/14634 257/443 |
| 2015/0287823 | A1* | 10/2015 | Ke | H01L 29/7833 257/410 |

FOREIGN PATENT DOCUMENTS

JP    H04-167469 A    6/1992

* cited by examiner

*Primary Examiner* — Shahed Ahmed
(74) *Attorney, Agent, or Firm* — Shapiro, Gabor and Rosenberger, PLLC

(57) ABSTRACT

In order to improve the performance of a solid-state imaging device, the solid-state imaging device has a pixel including a photoelectric conversion unit and a transfer transistor, and fluorine is introduced to a gate electrode and a drain region (extension region and $n^+$-type semiconductor region) of the transfer transistor included in the pixel.

10 Claims, 12 Drawing Sheets

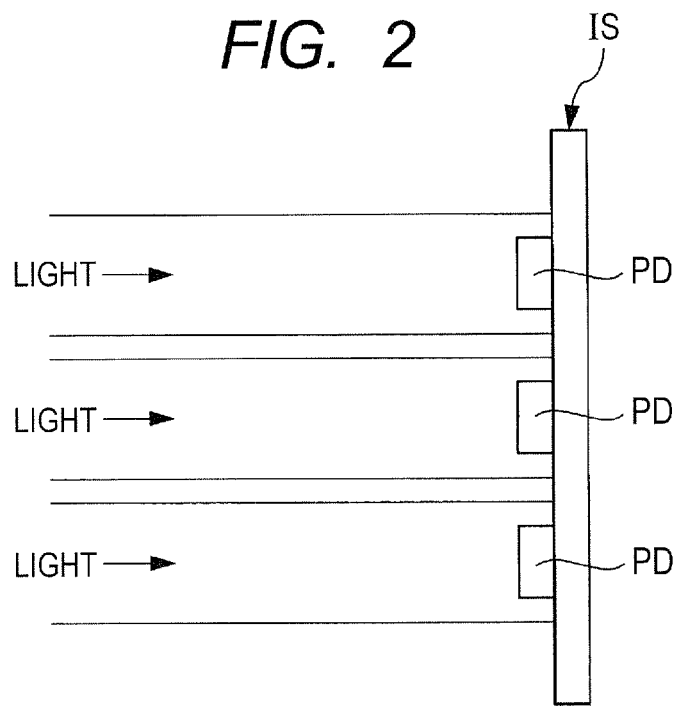
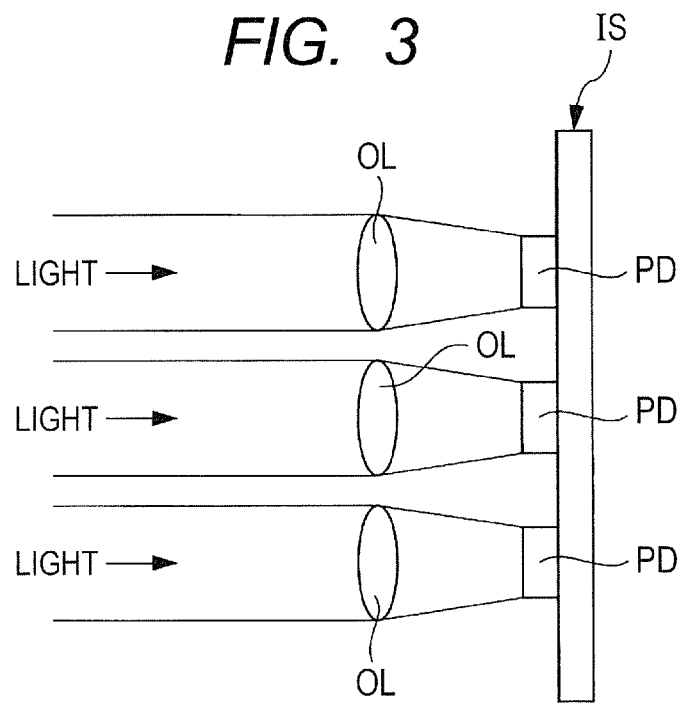

SOLID-STATE IMAGING DEVICE AND ITS MANUFACTURING METHOD

CROSS-REFERENCE TO RELATED APPLICATIONS

The disclosure of Japanese Patent Application No. 2017-113764 filed on Jun. 8, 2017 including the specification, drawings and abstract is incorporated herein by reference in its entirety.

BACKGROUND

The invention relates to, for example, a solid-state imaging device typified by the Complementary Metal Oxide Semiconductor (CMOS) image sensor and its manufacturing technique.

Japanese Patent Laid-Open No. 4-167469 discloses a technique for introducing fluorine to the whole polycrystalline silicon film (polysilicon film) formed on a semiconductor substrate.

SUMMARY

For a solid-state imaging device, it is desirable to be dark in a photoelectric conversion unit with no electrons accumulated in the mode of no incident light (dark mode).

In the actual solid-state imaging device, however, even in the mode of no incident light, electrons are accumulated in the photoelectric conversion unit caused by metal contamination, crystalline defect, and interface level between a gate insulating film and a silicon substrate. As the result, the electrons accumulated in the photoelectric conversion unit of the solid-state imaging device generate a small signal also in the dark mode, to deteriorate a black level of an image. This small signal causing the above phenomenon is called "dark current" and in order to improve the performance of the solid-state imaging device, reduction of the "dark current" is desired.

Other objects and novel characteristics will be apparent from the description of the specification and the attached drawings.

A solid-state imaging device according to one embodiment has a pixel including a photoelectric conversion unit and a transfer transistor, and fluorine is introduced to the gate electrode and the drain region of the transfer transistor included in the pixel.

According to the embodiment, it is possible to improve the performance of the solid-state imaging device.

BRIEF DESCRIPTION OF THE DRAWINGS

FIG. 2 is a view showing a structure when any microlens is not provided in the image sensor.

FIG. 3 is a view showing an example of arranging microlenses in front of the photodiode.

DETAILED DESCRIPTION

In the following embodiments, a description will be made by dividing into a plurality of sections or embodiments when necessary for the convenience sake, these are not unrelated to each other but are related to each other such that one covers some or all of modifies examples, details, supplemental explanation and so forth of the other unless otherwise clearly specified.

In addition, in the following embodiments, when the number of elements (including the number of units, a numerical value, an amount, a range and the like) is referred to, it is not limited to the specific number but may be more than or not more than the specific number unless otherwise clearly specified and unless otherwise definitely restricted to the specific number in principle.

In addition, in the following embodiments, the constitutional element (including an element step) is not necessarily indispensable unless otherwise clearly specified and unless otherwise thought to be clearly indispensable in principle.

Similarly, in the following embodiments, when the shapes of the constitutional elements and their positional relationship are referred to, the ones that are substantially approximate or similar to the shapes will be included unless otherwise clearly specified and unless otherwise clearly thought that it is not so in principle. The same also applies to the above-mentioned number and range.

In all of the drawings depicted in order to describe the embodiments, the same codes are assigned to the same members and the repetitive description thereof is omitted. Further, hatching may be added to make a view easy to understand even in a plan view.

<Schematic Structure of Image Sensor (Solid-State Imaging Device)>

Figure 1:
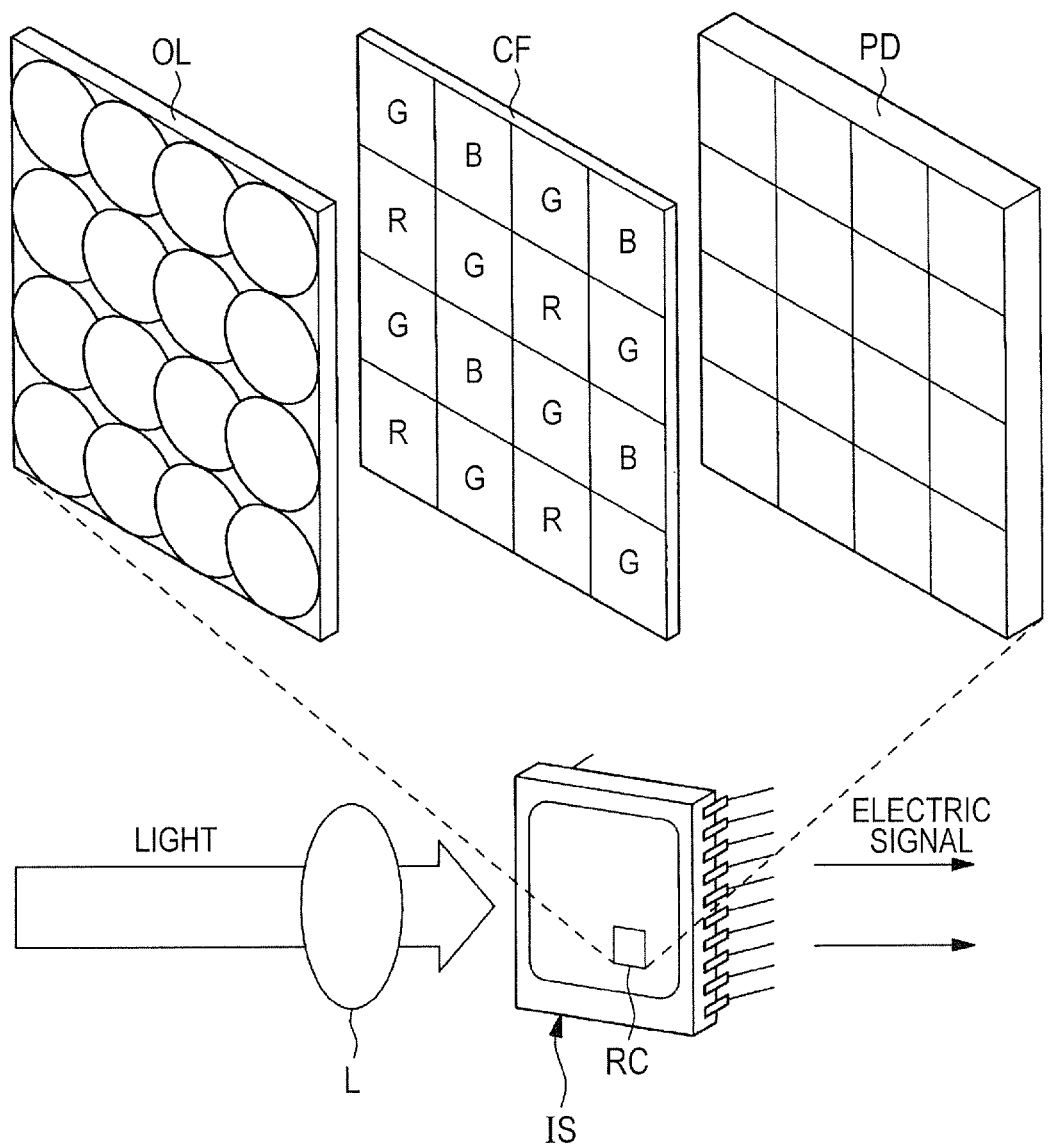
FIG. 1 is a view showing a state of converting light to electric signal, in an image sensor.

In the embodiment, an image sensor (solid-state imaging device) of picking up an image will be described with reference to the drawings. At first, the schematic structure of the image sensor will be described. The image sensor is an element of converting input light into electric signals. FIG. 1 is a schematic view showing the state of converting light into electric signals in the image sensor. For example, as shown in FIG. 1, the light emitted from an object enters a lens L and forms an image. An image sensor IS is arranged at this image forming position of the lens L and irradiated with the image formed by the lens L. Upon irradiation with the light, the image sensor IS converts the light into electric signals. The electric signals output from the image sensor IS are processed, hence to generate an image. As mentioned above, the image sensor IS has a function of converting the incident light into electric signals and outputting the signals.

When a light receiving surface RC of the image sensor IS is enlarged, a microlens OL, a color filter CF, and a photodiode PD are arranged on the light receiving surface RC. The image sensor IS includes the microlens OL, the color filter CF, and the photodiode PD. Hereinafter, the functions of the respective constitutional elements forming the image sensor IS will be sequentially described.

<Structure and Function of Microlens>

At first, the microlens OL will be described. FIG. 2 is a view schematically showing the structure when any microlens OL is not provided in the image sensor IS. As shown in FIG. 2, when no microlens OL is provided in the image sensor IS, not only the photodiode PD arranged on the light receiving surface of the image sensor IS but also the peripheral region around the photodiode PD is irradiated with the light incident to the image sensor IS. A plurality of photodiodes PD are arranged in an array on the light receiving surface of the image sensor IS and the individual photodiodes PD are arranged at regular intervals. Accordingly, all the light incident to the image sensor IS enters not only the photodiodes PD but also the gaps between the photodiodes PD.

The light incident to the photodiodes PD can be converted into electric signals, but the light incident to the gaps between the plural photodiodes PD cannot be converted into electric signals because it is not to irradiate the photodiodes PD. In other words, the light incident to the gaps between the photodiodes PD is wasted. The whole light incident to the image sensor IS is designed to be converted into electric signals as many as possible; however, when the image sensor IS is not provided with the microlens OL, there is much wasted light without being converted into the electric signals in the image sensor IS.

In order to solve the above problem, the photodiodes PD may be arranged without gap; however, since a scanning circuit for transferring the electric charges converted in the individual photodiodes PD has to be provided, there must be a gap between the plural photodiodes PD. For example, when the image sensor IS is formed by one large photodiode PD, a gap is unnecessary on the light receiving surface; in this case, however, a sufficient resolving power of an image cannot be obtained. In order to improve the image resolving power, a plurality of small individual photodiodes PD have to be arranged on the light receiving surface as many as possible. In this case, the electric charges from the respective photodiodes PD have to be converted into electric signals independently, and in order to electrically isolate the individual photodiodes PD, a gap (insulation region) has to be provided at regular intervals. Therefore, it is difficult to completely do away with the gaps generated between the individual photodiodes PD.

In order to convert the light incident to the image sensor IS into electric signals efficiently, the image sensor IS is provided with the microlenses OL. FIG. 3 is a schematic view showing an example of arranging the microlenses OL in front of the photodiodes PD. As shown in FIG. 3, the respective microlenses OL are arranged in correspondence with the respective photodiodes PD. In short, the microlenses OL are arranged for the same number as that of the photodiodes PD. As shown in FIG. 3, the light incident to the image sensor IS enters the microlens OL. The light incident to the microlens OL is converged to irradiate the photodiode PD. Thus, the microlens OL has a function of converging the light incident to the image sensor IS on the photodiode PD. In other words, the light irradiating the gaps between the photodiodes PD without entering the photodiodes PD in the case of providing no microlens OL can be refracted to enter the photodiodes PD with the microlenses OL. The microlens OL has a function of concentrating the incident light to irradiate the photodiode PD. Therefore, by providing the image sensor IS with the microlenses OL, the light incident to the gaps between the photodiodes PD can be concentrated on the photodiodes PD; as the result, the light incident to the image sensor IS can be converted into electric signals efficiently.

<Structure and Function of Color Filter>

Figure 4:
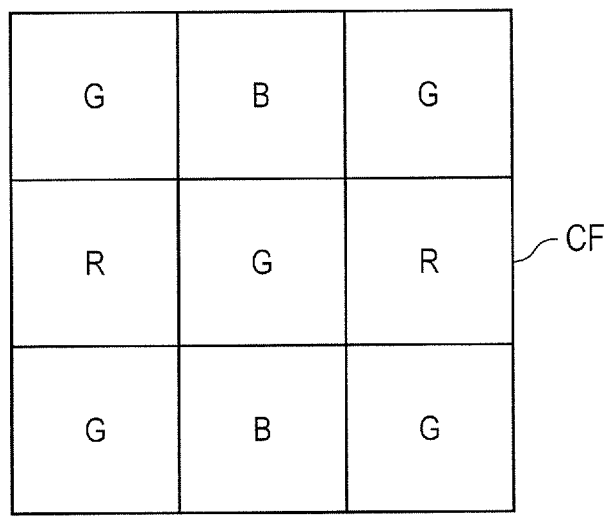
FIG. 4 is a view showing a primary color filter as one color filter.

Continuously, the color filter CF will be described. The photodiode PD of converting the light into the electric signals has a function of identifying not color but just gray scale of the light. Only with the photodiode PD, an image taken by the image sensor becomes monochrome. Therefore, the color filter CF is provided in the image sensor IS to generate a color image. Human eyes can sense only three primary colors of "red", "green", and "blue"; by adjusting the light amounts of these three primary colors, a man can sense whatever color. This is referred to as "Additive Color Mixture by Three Primary Colors of Light". For example, the same light amounts of "red" and "green" are mixed as "yellow". In other words, with the same light amounts of "red" and "green" and no light amount of "blue", it becomes yellow as a complementary color of "blue". The same amounts of "red", "green", and "blue" are mixed as white. On the other hand, with no light amount in "red", "green", and "blue", it becomes black. This principle is used as the color filter CF shown in FIG. 4. FIG. 4 shows the primary color filter as one color filter CF. The primary color filter is a filter using three primary colors of Red, Green, and Blue (RGB). By providing the primary color filter in front of the photodiodes PD, the photodiodes PD corresponding to the respective colors can be obtained. For example, the photodiode PD put in front of the red color filter is to detect the light amount of red, the photodiode PD put in front of the green color filter is to detect the light amount of green. Likewise, the photodiode PD put in front of the blue color filter is to detect the light amount of blue. Thus, various colors can be realized according to the respective light amounts of the photodiode PD for red, the photodiode PD for green, and the photodiode PD for blue.

Here, the red color filter, the green color filter, and the blue color filter forming the color filter CF are not arranged simply but arranged with a basic pattern of, for example, the Bayer arrangement shown in FIG. 4. In short, the color filter CF is formed by repetition of the basic pattern including the red color filter, the green color filter, and the blue color filter in combination.

The primary color filter using the three primary colors of RGB is good in reproducibility of color in an image but poor in sensibility of the image sensor IS, defective in taking pictures in a dark place. Therefore, the primary color filter is often used in the large scaled image sensor IS having a good sensibility.

Figure 5:
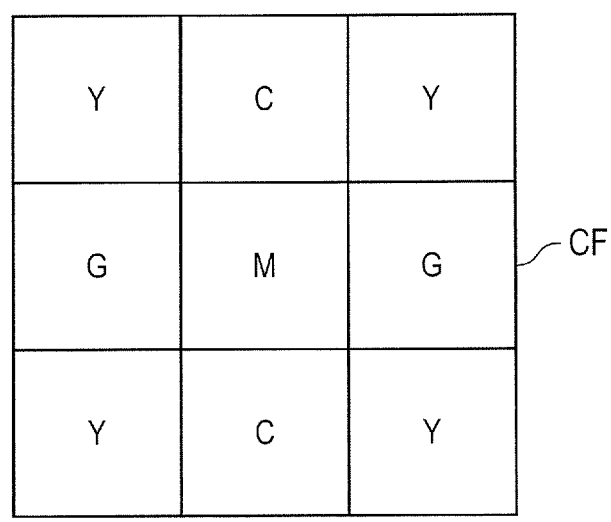
FIG. 5 is a view showing a complementary color filter as another color filter.

The color filter CF includes the complementary color filter as another color filter than the primary color filter using the three primary colors of RGB. The complementary color filter includes four kinds of colors, for example, cyan (C), magenta (M), yellow (Y), and additionally green (G), as shown in FIG. 5. For the image sensor using the complementary color filter, it is necessary to convert from CMYG into RGB, considering that a man actually sees the picked up image, and there occurs a noise in this conversion. The complementary color filter has the advantage that the sensibility is better than the primary color filter; therefore, the complementary color filter is often used in the small sized (in other words, having a lower sensibility) image sensor IS.

<Photodiode>

Figure 6:
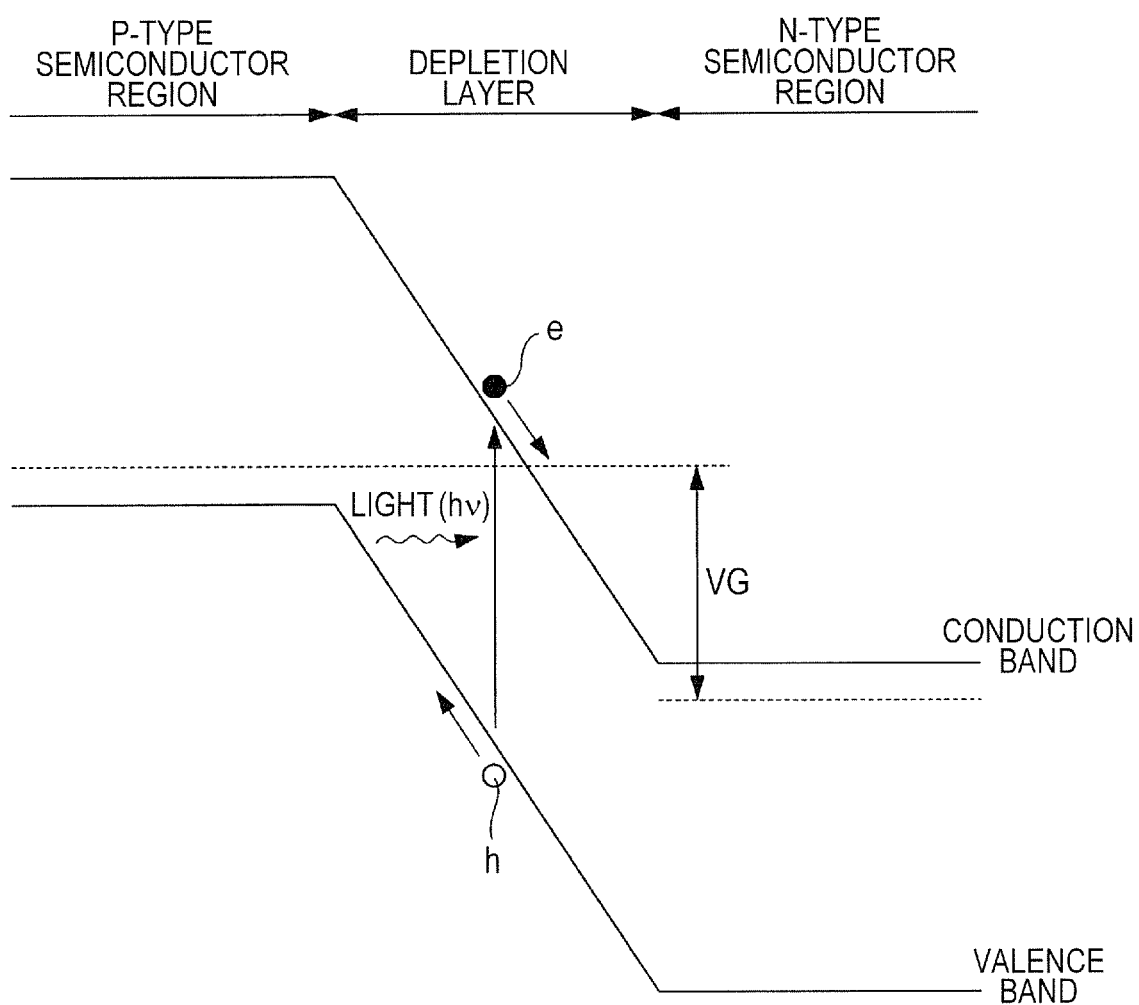
FIG. 6 is a view showing a band structure of a diode by pn junction.

Next, the structure of the photodiode PD will be described. The photodiode PD has a function as the photoelectric conversion unit of generating electric charges upon receipt of irradiation of light. This photodiode PD can be formed by, for example, a diode by the pn junction. FIG. 6 is a view showing the band structure of the diode by the pn junction. As shown in FIG. 6, the left side is the p-type semiconductor region and the right side is the n-type semiconductor region. The boundary between the p-type semiconductor region and the n-type semiconductor region is a center region and becomes a depletion layer. In the diode thus included by the pn junction, for example, when the light (hv) having the energy more than the bandgap enters the depletion layer, this light is absorbed by the depletion layer. Specifically, when the light is absorbed by the electrons existing in a valence band, the electrons obtain the energy more than the bandgap. The electrons having obtained the energy more than the bandgap are moved to the conduction band, passing over the bandgap. As the result, there occurs an electron-hole pair by the electron e moved to the conduction band and the hole h generated in the valence band through the movement of the electron to the conduction band. The generated electron e and hole h are accelerated by a reverse voltage VG applied to the photodiode PD. In other words, in the photodiode PD, generally the reverse voltage VG is applied to the diode by the pn junction. The reverse voltage VG is a voltage applied in a direction of raising a barrier by the pn junction. Specifically, a positive voltage is applied to the n-type semiconductor region and a negative voltage is applied to the p-type semiconductor region. According to this structure, for example, the electron e and the hole h generated in the depletion layer are accelerated in a high electric field by the reverse voltage VG. As the result, the ratio of recoupling the electron e and the hole h can be reduced, hence to obtain the sufficient current. As mentioned above, the photodiode PD is formed.

<Device Structure of Light Receiving Unit>

The device structure of the light receiving unit in the image sensor will be described.

The image sensor includes a semiconductor substrate having an imaging region with a plurality of pixels formed there. Here, the imaging region is provided with the photoelectric conversion unit (photodiode) for converting the incident light into electric charge and a transfer transistor for transferring the electric charge. The transfer transistor has a source region and a drain region formed at a distance from each other within the semiconductor substrate, a channel region sandwiched by the source region and the drain region, a gate insulating film formed on the channel region, and a first gate electrode formed on the gate insulating film.

Hereinafter, the concrete device structure will be described.

Figure 7:
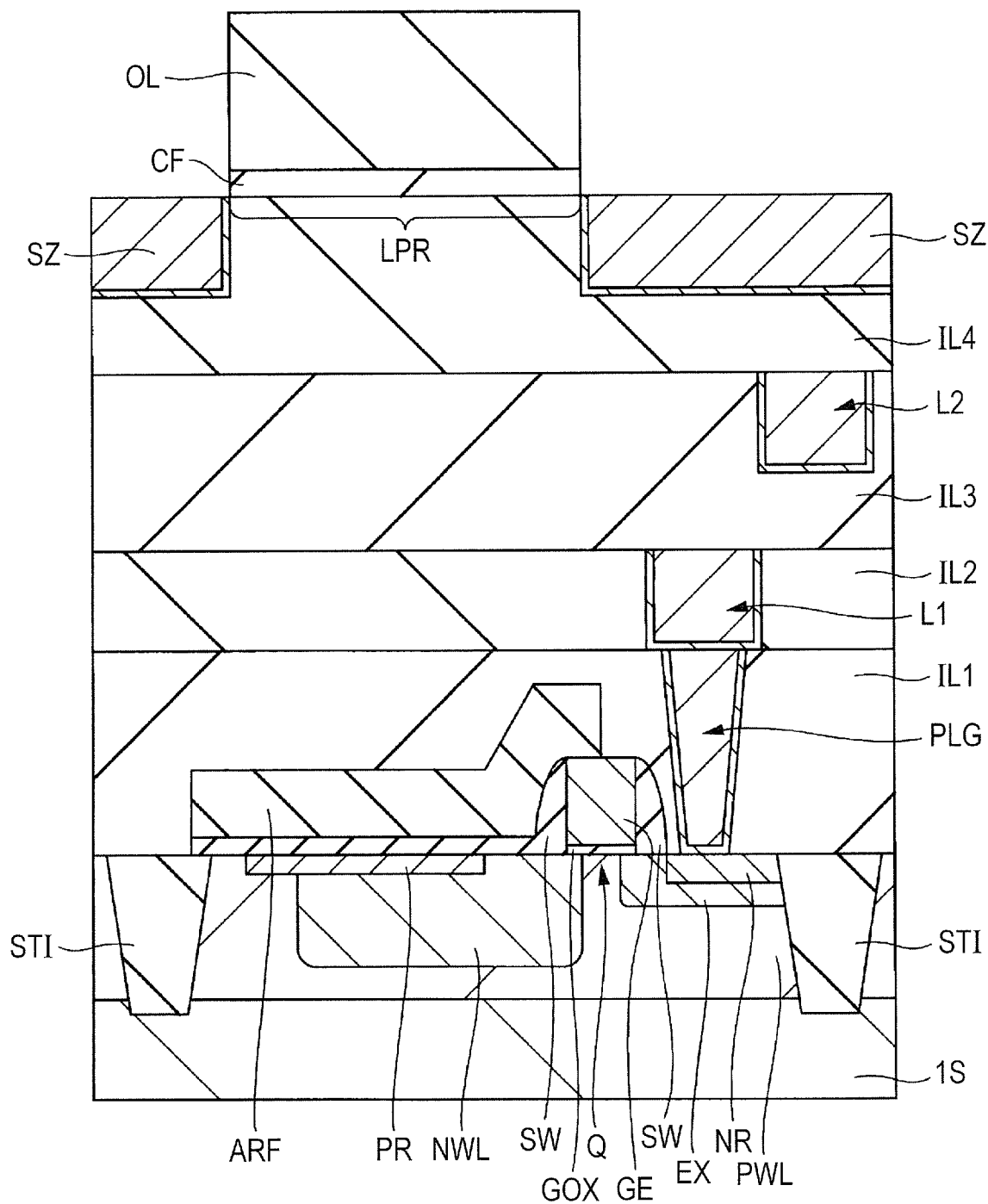
FIG. 7 is a cross-sectional view showing one example of a device structure of a light receiving unit.

FIG. 7 is a cross-sectional view showing one example of the device structure of the light receiving unit. In FIG. 7, for example, a semiconductor substrate 1S made of a silicon substrate with the n-type dopant (donor) such as phosphorus (P) or arsenic (As) introduced is arranged, and an element isolation region STI is formed on the surface (main surface, element forming surface) of the semiconductor substrate 1S. This element isolation region STI partitions an active region and the light receiving unit is formed in the partitioned active region. Concretely, the p-type well PWL with the p-type dopant (acceptor) such as boron introduced is formed in the semiconductor substrate 1S, and the n-type well NWL with the n-type dopant such as phosphorus (P) or arsenic (As) introduced is formed to be accommodated within the p-type well PWL. The photodiode (pn junction diode) is formed by the p-type well PWL ($p^-$-type semiconductor region) and the n-type well NWL ($n^-$-type semiconductor region). The photodiode works as the photoelectric conversion unit of converting the incident light into the electric charge and includes the n-type well NWL accommodated within the p-type well PWL in plan view.

A $p^+$-type semiconductor region PR having a higher dopant concentration than the p-type well PWL is formed on a part of the surface of the n-type well NWL. The $p^+$-type semiconductor region PR is distant from the gate electrode GE. This $p^+$-type semiconductor region PR is a region formed for the purpose of suppressing the generation of electrons based on the interface levels formed on the surface of the semiconductor substrate 1S. In other words, electrons are generated on the surface region of the semiconductor substrate 1S, even in the state of no irradiation of light, because of the influence of the interface levels, which causes an increase of the dark current. Therefore, by forming the $p^+$-type semiconductor region PR with the hole as a majority carrier on the surface of the n-type well NWL with the electron as a majority carrier, the generation of the electrons in the state of no irradiation of light is suppressed and an increase in the dark current is suppressed. The $p^+$-type semiconductor region PR does not have to be distant from the gate electrode GE.

A gate insulating film GOX is formed on the semiconductor substrate 1S to overlap with a part of the n-type well NWL in plan view, and the gate electrode GE is formed on the gate insulating film GOX. A sidewall spacer SW is formed on the both sidewalls of the gate electrode GE. For example, the gate insulating film GOX is formed of a silicon oxide film; however, it is not restricted to this, but may be formed of a high dielectric constant film having a higher dielectric constant than the silicon oxide film. For example, the gate insulating film may be formed of a hafnium-based insulating film with lanthanum oxide introduced to hafnium oxide. The gate electrode GE can be formed of, for example, a polysilicon film, and the sidewall spacer SW can be formed of, for example, a silicon oxide film, a silicon nitride film, or a film stack of the silicon oxide film and the silicon nitride film.

Next, an extension region EX formed of the $n^-$-type semiconductor region is formed within the semiconductor substrate 1S in alignment with the gate electrode GE and the $n^+$-type semiconductor region NR is formed in alignment with the sidewall spacer SW. The drain region is formed by the extension region EX and the $n^+$-type semiconductor region NR.

As mentioned above, the photodiode and the transfer transistor Q are formed on the semiconductor substrate 1S. Specifically, the photodiode is formed by the p-type well PWL and the n-type well NWL and the transfer transistor Q is formed with the above mentioned n-type well NWL defined as the source region and the extension region EX and the $n^+$-type semiconductor region NR formed in the semiconductor substrate 1S at a predetermined distance from the n-type well NWL defined as the drain region.

A region sandwiched by the source region and the drain region is defined as a channel forming region, and the gate electrode GE is formed on the channel fainting region through the gate insulating film GOX. According to this, the transfer transistor Q including the source region, the drain region, the channel forming region, the gate insulating film GOX, and the gate electrode GE is formed. In plan view, the n-type well NWL and the gate electrode GE has an overlapping region. Further, the photodiode and the transfer transistor Q formed in the active region of the semiconductor substrate 1S shares the n-type well NWL and is electrically coupled together.

A silicide film can be also formed on the surface of the drain region ($n^+$-type semiconductor region NR) in the transfer transistor Q. According to this, for example, a connection resistance between the drain region and a plug PLG can be reduced. The silicide film can be formed of, for example, a nickel-platinum silicide film, a nickel silicide film, a titanium silicide film, a cobalt silicide film, or a platinum silicide film.

Continuously, the wiring structure formed in the upper layer above the photodiode and the transfer transistor Q formed in the semiconductor substrate 1S will be described with reference to FIG. 7. In FIG. 7, an insulating film is formed on the surface of the photodiode (the surface of the n-type well NWL and the $p^+$-type semiconductor region PR). The insulating film has a function of keeping the surface property (interface property) of the semiconductor substrate 1S favorably, and formed of, for example, a silicon oxide film or a silicon nitride film. An antireflection film ARF is formed on the insulating film, and the antireflection film ARF is formed of, for example, a silicon oxynitride film.

An interlayer insulating film IL1 is formed to cover the semiconductor substrate 1S including the gate electrode GE and the antireflection film ARF, and a plug PLG penetrating the interlayer insulating film IL1 and arriving at the $n^+$-type semiconductor region NR (drain region) is formed. The interlayer insulating film IL1 is formed of, for example, a silicon oxide film made of tetra ethyl ortho silicate (TEOS) as raw material. The plug PLG is formed, for example, by embedding a barrier conductor film made of a titanium film and a titanium nitride film formed on the titanium film (titanium film/titanium nitride film) and a tungsten film formed on the barrier conductor film into the contact hole formed in the interlayer insulating film IL1.

For example, an interlayer insulating film IL2 is formed on the interlayer insulating film IL1 with the plug PLG formed, and the wiring L1 is formed in the interlayer insulating film IL2. For example, the interlayer insulating film IL2 is formed of, for example, a silicon oxide film and not restricted to this but may be formed of a low dielectric constant film having a lower dielectric constant than the silicon oxide film. As the low dielectric constant film, for example, a SiOC film can be used. The wiring L1 is formed of, for example, copper wiring and the Damascene method can be used to form the wiring. The wiring L1 is not restricted to the copper wiring but it may be formed of aluminum wiring. Further, an interlayer insulating film IL3 made of, for example, a silicon oxide film or a low dielectric constant film is formed on the interlayer insulating film IL2 with the wiring L1 formed, and the wiring L2 is formed in the interlayer insulating film IL3. Further, an interlayer insulating film IL4 is formed on the interlayer insulating film IL3 with the wiring L2 formed there and a light shielding band SZ is formed on the interlayer insulating film IL4.

Here, the wirings L1 and L2 and the light shielding band SZ are formed not to overlap with the photodiode in plan view, and a light penetrating unit LPR is formed in the region overlapping with the photodiode in plan view. This is in order to avoid the light incident to the photodiode from being disturbed by the wirings L1 and L2 and the light shielding band SZ. The microlens OL is mounted on the light penetrating unit LPR through the color filter CF. The light shielding band SZ is provided in order to separate the lights incident to the adjacent photodiodes individually. In short, the light shielding band SZ has a function of suppressing the leaked light between the adjacent light receiving units.

The light receiving unit is formed as mentioned above and hereinafter, its operation will be briefly described. In FIG. 7, when the light receiving unit is irradiated with the light, the incident light passes through the microlens OL and the color filter CF. Then, passing the light penetrating unit LPR partitioned by the light shielding band SZ and further through the interlayer insulating films IL4 to IL1 transparent to visible light, the light enters the antireflection film ARF. In the antireflection film ARF, the reflection of the incident light is suppressed and a sufficient light amount of the incident light enters the photodiode. In the photodiode, because the energy of the incident light is larger than the bandgap of the silicon, the incident light is absorbed through the photoelectric conversion to generate electron-hole pairs. The electrons generated here are accumulated in the n-type well NWL. At a proper timing, the transfer transistor Q is turned on. Specifically, a voltage of a threshold voltage and more is applied to the gate electrode of the transfer transistor Q. Then, the channel region (the n-type semiconductor region) is formed in a channel forming region just below the gate insulating film, hence to electrically couple the source region (the n-type well NWL) and the drain region (the extension region EX and the $n^+$-type semiconductor region NR) of the transfer transistor Q. As the result, the electrons accumulated in the n-type well NWL pass through the channel region, arrive at the drain region, and are transmitted from the drain region through the wiring layer, hence to be taken out to the outside circuit. According to this, the light receiving unit operates.

<Circuit Structure of Pixel>

Figure 8:
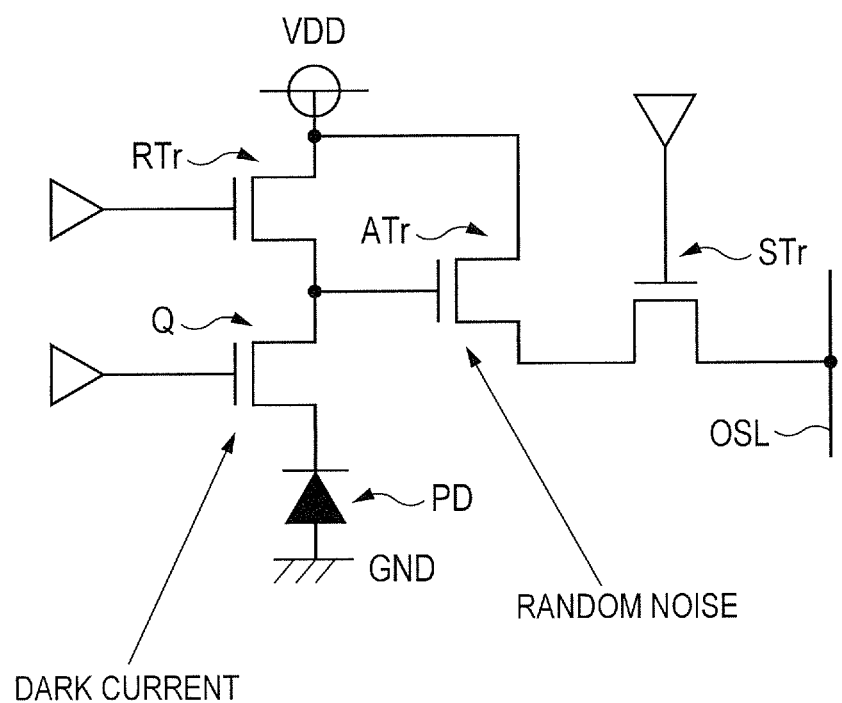
FIG. 8 is a circuit diagram showing a circuit structure of a pixel.

Next, each circuit structure of a plurality of pixels forming the image sensor will be described. FIG. 8 is a circuit diagram showing the circuit structure of a pixel. In FIG. 8, a pixel includes the photodiode PD, the transfer transistor Q, a reset transistor RTr, an amplifier transistor ATr, and a select transistor STr. The photodiode PD works as the photoelectric conversion unit of converting the incident light to the pixel into the electric charges, and the transfer transistor Q has a function of transferring the electric charges converted in the photodiode PD. Further, the reset transistor RTr works as the transistor for resetting the electric charges, and the amplifier transistor ATr has a function of amplifying the voltage signal based on the electric charges transferred by the transfer transistor Q. Further, the select transistor STr has a function of outputting the voltage signal amplified by the amplifier transistor ATr to an output signal line OSL.

In FIG. 8, the anode of the photodiode PD is coupled to a reference potential (GND) and the cathode of the photodiode PD is electrically coupled to the source of the transfer transistor Q. The drain of the transfer transistor Q is electrically coupled to the source of the reset transistor RTr, and the drain of the reset transistor RTr is electrically coupled to the power supply potential (VDD). Further, the drain of the transfer transistor Q is electrically coupled to the gate electrode of the amplifier transistor ATr, and the drain of the amplifier transistor ATr is electrically coupled to the power supply potential (VDD), together with the drain of the reset transistor RTr. In short, the amplifier transistor is arranged to be a source follower. On the other hand, the source of the amplifier transistor ATr is electrically coupled to the select transistor STr and the select transistor STr is electrically coupled to the output signal line OSL. When the output voltage supplied from the amplifier transistor is almost the same as the input voltage entered to the amplifier transistor, it is to be included in "amplifier" in this specification. Further, as shown in FIG. 8, the drain of the transfer transistor Q is electrically coupled to the gate electrode of the amplifier transistor ATR.

The circuit forming the pixel in the image sensor is included as mentioned above, and its operation will be hereinafter described briefly. At first, the electric charges are generated from the incident light by the photodiode PD and accumulated in the photodiode PD. When turning on the transfer transistor Q, the electric charges accumulated in the photodiode PD are transferred to the gate electrode of the amplifier transistor ATr through the transfer transistor Q. Thereafter, the voltage signal based on the electric charges is amplified by the amplifier transistor ATr. When turning on the select transistor STr, the voltage signal amplified by the amplifier transistor ATr is output to the output signal line OSL. According to this, the voltage signal corresponding to the incident light can be taken out from the pixel. By turning on the reset transistor RTr, the electric charges accumulated in the photodiode PD are taken out not to the output signal line OSL but to the power supply potential side to do the reset operation.

<Investigation of Improvement>

The inventors et al. have investigated further improvement from the viewpoint of improving the performance of the image sensor (solid-state imaging device). For example, as a factor of reducing the performance of the image sensor, there are noises called "random noise" and called "dark current". When these noises get larger, the performance of the image sensor is deteriorated. Therefore, in order to improve the performance of the image sensor, it is necessary to reduce the noise to the minimum possible extent.

Specifically, the "random noise" is generated from the amplifier transistor ATr, for example, as shown in FIG. 8. The "random noise" is caused by amplification variation in the amplifier transistor ATr, which means that the signals having the same level become the signals having various intensities, resulting in an image flicker. The "random noise" becomes the main cause of the image flicker. This "random noise" has a strong correlation with 1/f noise (flicker noise) generated in an n-channel typed field-effect transistor called the amplifier transistor ATr included in the pixel. Therefore, in order to reduce the "random noise", it is important to reduce the 1/f noise generated in the amplifier transistor ATr.

On the other hand, the inventors et al. pay attention to the "dark current" not the above mentioned "random noise", as the noise generated in the image sensor. The "random noise" is the main cause of the image flicker, while the "dark current" is the main cause of deteriorating the S/N ratio in the image sensor. Specifically, when the "dark current" gets larger, the black level of the image in the dark mode is reduced. This means that when the "dark current" gets larger, the sensibility of the image sensor is deteriorated. Therefore, in order to improve the sensibility of the image sensor, it is important to reduce the noise caused by the "dark current".

The inventors et al. have found that the "dark current" is caused by the transfer transistor Q shown in FIG. 8. In short, the above mentioned "random noise" is caused by the amplifier transistor ATr shown in FIG. 8, while the "dark current" noticed by the inventors et al. is caused by the transfer transistor Q shown in FIG. 8.

<<Occurrence Mechanism of "Dark Current">>

Figure 9:
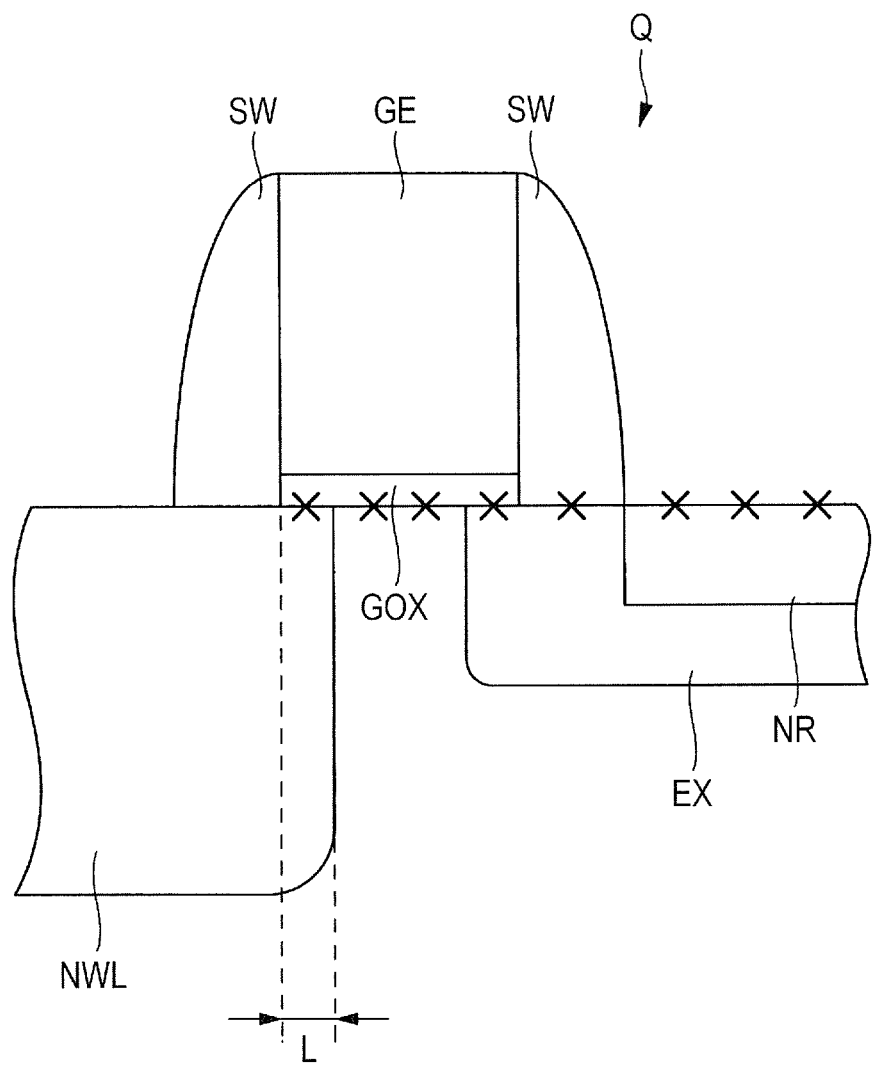
FIG. 9 is a schematic view showing an enlarged part of a transfer transistor.

Hereinafter, the occurrence mechanism of the "dark current" caused by the transfer transistor Q shown in FIG. 8 will be described. FIG. 9 is a schematic view showing a part of the transfer transistor Q in an enlarged way. As shown in FIG. 9, the n-type well NWL forming a part of the photoelectric conversion unit works as the source region of the transfer transistor Q, the extension region EX is formed at a distance from the source region, and the $n^+$-type semiconductor region NR is formed accommodated into the extension region EX. The extension region EX and the $n^+$-type semiconductor region NR form the drain region.

Next, in FIG. 9, the region sandwiched by the source region (n-type well NWL) and the drain region (the extension region EX and the $n^+$-type semiconductor region NR) is the channel region and the gate insulating film GOX is formed on the channel region. The gate electrode GE is formed on the gate insulating film GOX and the sidewall spacers SW are formed on the both lateral sides of the gate electrode GE. According to this, the transfer transistor Q is formed.

Here, for example, the gate insulating film GOX is formed of a silicon oxide film and the channel region is formed of silicon; accordingly, there is a dangling bond of silicon in the interface between the gate insulating film GOX and the channel region. Then, an interface level caused by the dangling bond is formed in the interface between the gate insulating film GOX and the channel region. Particularly, in FIG. 9, the existence of the interface level schematically indicates "x". These interface levels exist not only in the interface between the gate insulating film GOX and the channel region but also in the interface between the extension region EX and the gate insulating film GOX, in the interface between the extension region EX and the sidewall spacer SW, and on the surface of the $n^+$-type semiconductor region NR.

The interface level has the energy between the valence band and the conduction band of silicon (semiconductor). In other words, the interface level exists within the bandgap between the valence band and the conduction band. As a result, without the interface level, the electron existing in the valence band cannot be shifted to the conduction band unless an energy more than the bandgap is given. Without the interface level, electrons existing in the valence band cannot be excited in the conduction band unless the light having the energy more than the bandgap is irradiated. In other words, without irradiation of the light having the energy more than the bandgap, a probability of the electrons shifting from the valence band to the conduction band is really low. This means that when there is no interface level and no irradiation of the light having the energy more than the bandgap, the dark current that is a flow of the electrons flowing in the conduction band is extremely small. Actually, however, the interface level exists, for example, in the interface between the gate insulating film GOX and the channel region. In this case, for example, even when the light having the energy more than the bandgap is not irradiated, the thermal excitation (energy of lattice vibration) generates a process of shifting the electrons from the valence band to the interface level and then from the interface level to the conduction band. This means that also in the dark mode of no irradiation of the light having the energy more than the bandgap, the probability of shifting the electrons from the valence band to the conduction band through the interface level is increased, hence to increase the recoupling of the electrons shifted to the conduction band with the holes of the valence band. This means an increase of the "dark current" through the recoupling of the electrons shifted to the conduction band with the holes of the valence band. According to this, the existence of the interface level causes an increase of the "dark current". Particularly, as the result of deteriorating the black level in an image in the dark mode caused by the "dark current" generated in the transfer transistor Q, the S/N ratio of the image sensor becomes smaller. In short, the "dark current" generated in the transfer transistor Q becomes the main cause of deteriorating the sensibility of the image sensor.

Then, the embodiment provides an idea to reduce the "dark current" generated in the transfer transistor Q, considering the above mentioned occurrence mechanism of the "dark current". Hereinafter, the technical idea in the embodiment will be described.

<Basic Idea in the Embodiment>

The basic idea in the embodiment is to couple the dangling bond of silicon as the occurring cause of the interface level with fluorine (F), in order to reduce the interface level indicated by "x", for example, in the transfer transistor Q shown in FIG. 9. As the result of reducing the dangling bond of silicon as the occurring cause of the interface level, the interface level can be reduced. Therefore, according to the basic idea in the embodiment, in the transfer transistor Q, occurrence of the "dark current" caused by the interface level can be reduced, hence to improve the performance of the image sensor. In other words, even when there is no irradiation of the light having the energy more than the bandgap but when there is the interface level, electrons are excited from the valence band to the conduction band by the thermal energy (energy of lattice vibration) smaller than the bandgap, through the interface level, and then, the excited electrons are recoupled with the holes of the valence band, which is the mechanism of a flow of the "dark current". Taking this mechanism into consideration, the basic idea in the embodiment takes notice of suppressing the interface level occurrence itself as the occurring cause of the "dark current". The basic idea in the embodiment is to couple the dangling bond with fluorine, considering that the interface level is caused by the dangling bond of silicon. According to the basic idea in the embodiment, in the transfer transistor Q, as the result of reducing the dangling bond of silicon as the occurring cause of the interface level, also the interface level caused by the dangling bond can be reduced. According to this, the basic idea in the embodiment can suppress the occurrence of the "dark current" caused by the interface level.

<Manufacturing Method of Image Sensor>

Next, a method of manufacturing the image sensor which realizes the above mentioned basic idea will be described with reference to the drawings.

Figure 10:
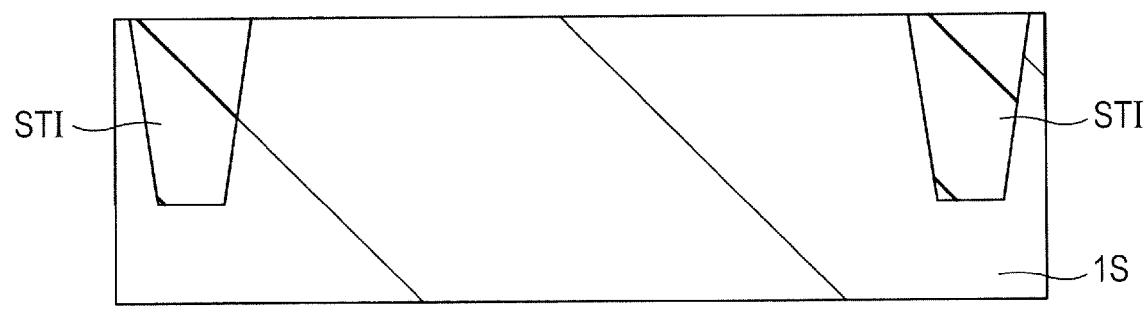
FIG. 10 is a cross-sectional view showing a manufacturing process of the image sensor according to the embodiment.

As shown in FIG. 10, a semiconductor substrate 1S made of silicon single crystal with the p-type dopant (acceptor) such as boron (B) introduced there is prepared. Here, the semiconductor substrate 1S is in a state of a semiconductor wafer having a substantially disc shape. The semiconductor substrate 1S may be the n-type substrate with the n-type dopant (donor) such as phosphorus (P) introduced, not only the p-type substrate.

An element isolation region STI for isolating the elements is formed on the main surface (top surface) of the semiconductor substrate 1S. The element isolation region STI is provided to avoid the mutual interference of the elements. The element isolation region STI can be formed, for example, according to the local Oxidation of silicon (LOCOS) method or the shallow trench isolation (STI) method. For example, according to the STI method, the element isolation region STI is formed as follows. An element isolation trench is formed on the semiconductor substrate 1S according to the photolithography and the etching. Then, a silicon oxide film is formed on the semiconductor substrate to be embedded into the element isolation trench, and thereafter, an unnecessary silicon oxide film formed on the semiconductor substrate is eliminated, according to the chemical mechanical polishing (CMP). According to this, the element isolation region STI with the silicon oxide film embedded only into the element isolation trench can be formed.

Figure 11:
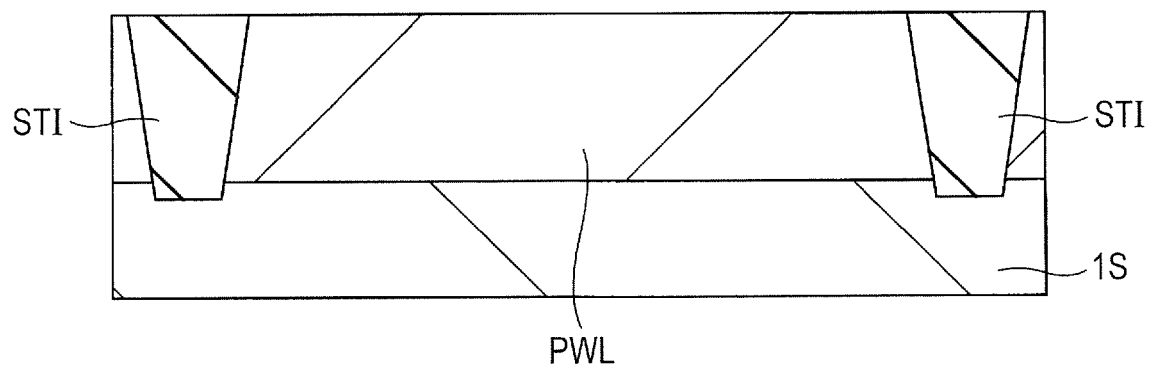
FIG. 11 is a cross-sectional view showing the manufacturing process of the image sensor following FIG. 10.
Figure 12:
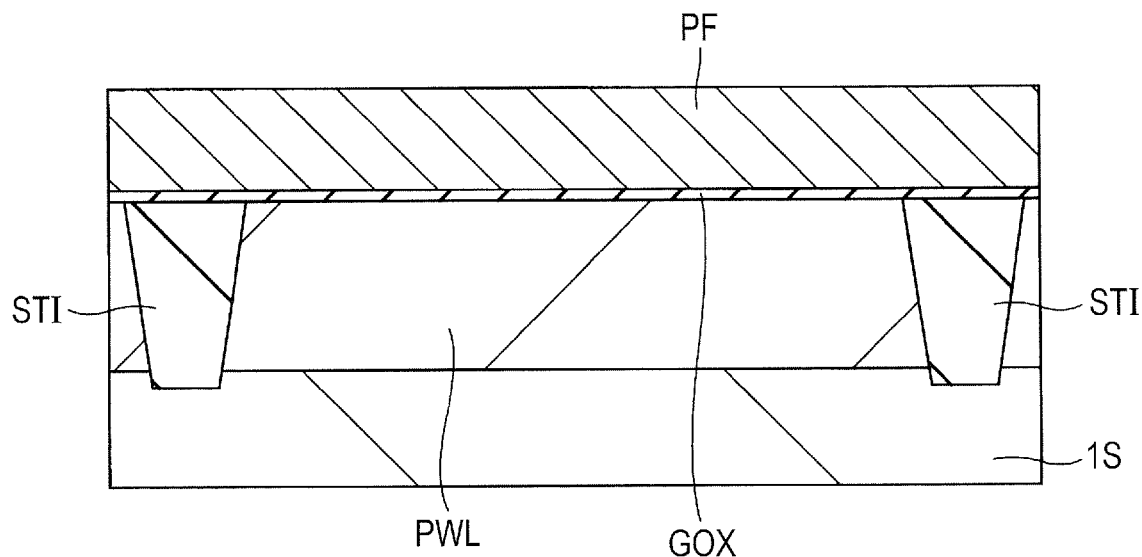
FIG. 12 is a cross-sectional view showing the manufacturing process of the image sensor following FIG. 11.

Continuously, as shown in FIG. 11, a p-type well PWL is formed by introducing the p-type dopant such as boron (B) into the semiconductor substrate 1S, according to the photolithography and the ion implantation. Then, as shown in FIG. 12, a gate insulating film GOX made of a silicon oxide film is formed on the surface of the p-type well PWL, for example, according to the thermal oxidation method. Here, the gate insulating film is not restricted to the silicon oxide film but it may be formed of a high dielectric constant film having a higher dielectric constant than the silicon oxide film. For example, the gate insulating film may be formed of a hafnium-based insulating film with lanthanum oxide introduced to hafnium oxide. A conductor film PF made of, for example, a polysilicon film is formed on the gate insulating film GOX.

Figure 13:
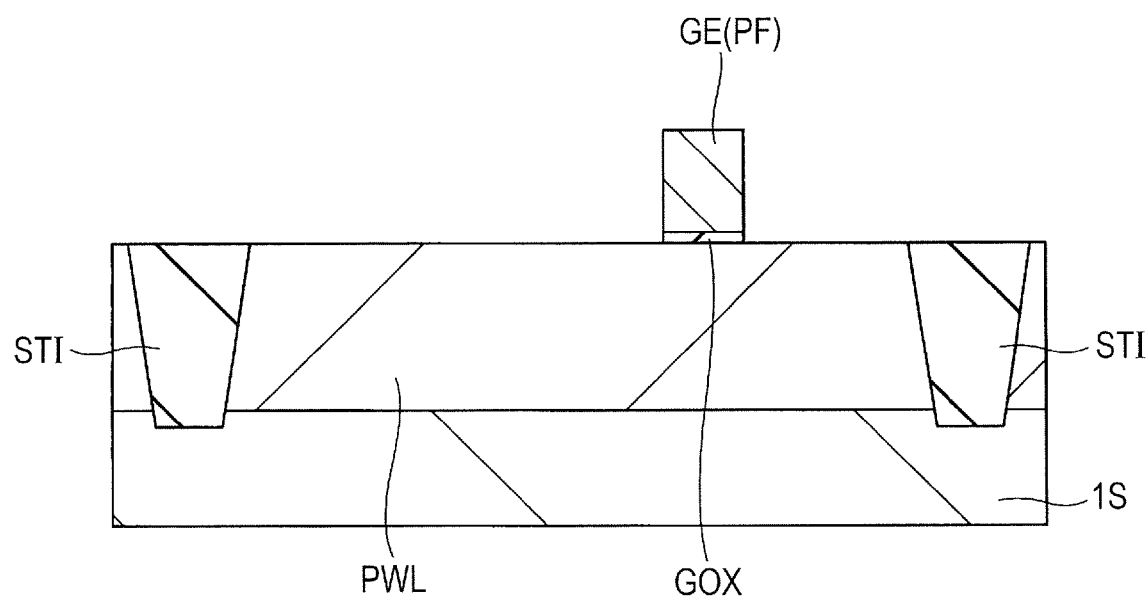
FIG. 13 is a cross-sectional view showing the manufacturing process of the image sensor following FIG. 12.

Then, as shown in FIG. 13, the conductor film PF is patterned according to the photolithography and the etching, to form the gate electrode GE of the transfer transistor.

Figure 14:
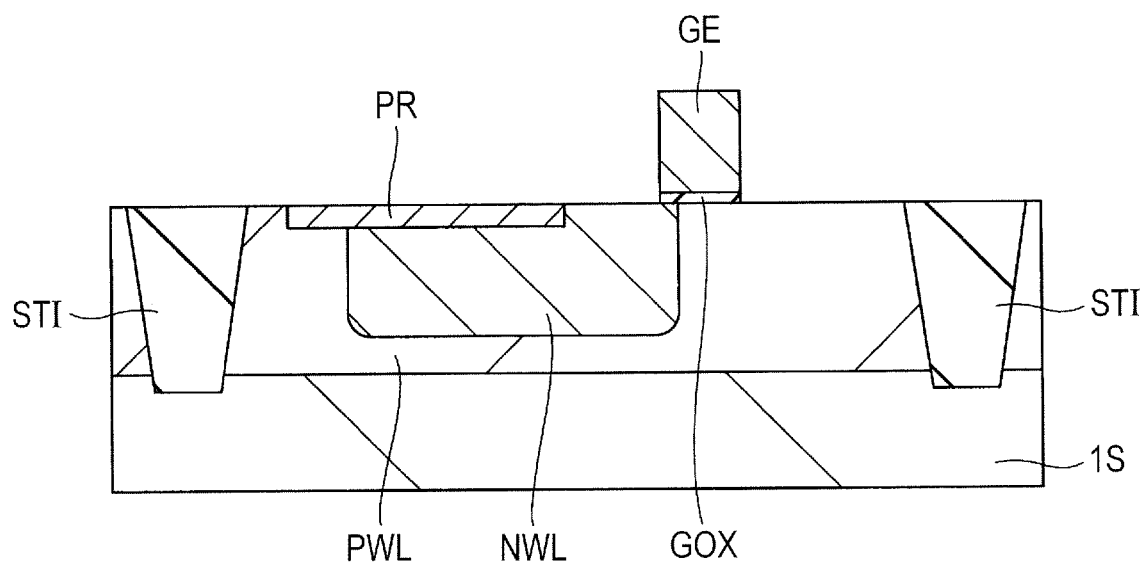
FIG. 14 is a cross-sectional view showing the manufacturing process of the image sensor following FIG. 13.

As shown in FIG. 14, the n-type dopant (donor) such as phosphorus (P) or arsenic (As) is introduced into the semiconductor substrate 1S according to the photolithography and the ion implantation. According to this, the n-type well NWL accommodated into the p-type well PWL can be fainted. The above mentioned p-type well PWL and n-type well NWL form a photodiode (photoelectric conversion unit). A part of the n-type well NWL is formed in a way of overlapping with the gate electrode GE of the transfer transistor in plan view. The reason why a part of the n-type well NWL overlaps with the gate electrode GE of the transfer transistor is because the n-type well NWL also works as the source region of the transfer transistor in order to enable the transfer transistor to operate. Thereafter, according to the photolithography and the ion implantation, the p-type dopant such as boron (B) is introduced into the surface of the n-type well NWL. According to this, the $p^+$-type semiconductor region PR can be formed on the surface of the n-type well NWL. In FIG. 14, the gate electrode GE and the $p^+$-type semiconductor region PR are illustrated at a distance; however, they are not restricted to this, but the $p^+$-type semiconductor region PR may be formed in contact with the gate electrode GE.

The manufacturing method of the image sensor in the embodiment is described taking an example of forming the image sensor in the order of the gate insulating film GOX→ the gate electrode GE→ the n-type well NWL→ the $p^+$-type semiconductor region PR. However, the method is not restricted to this but may be in the order of the n-type well NWL→ the $p^+$-type semiconductor region PR→ the gate insulating film GOX→ the gate electrode GE.

Figure 15:
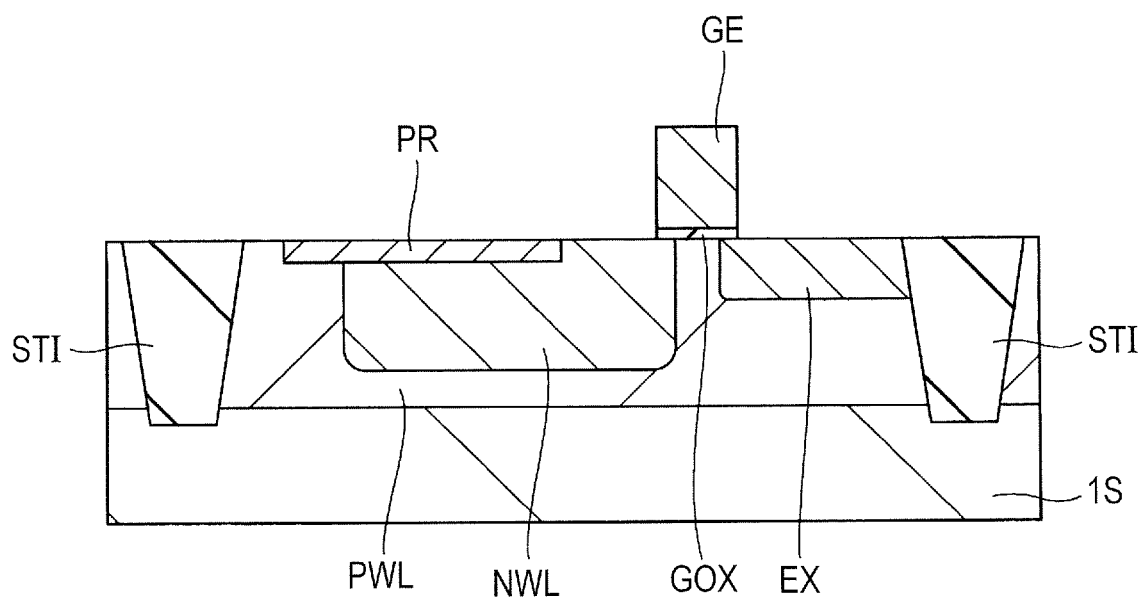
FIG. 15 is a cross-sectional view showing the manufacturing process of the image sensor following FIG. 14.
Figure 16:
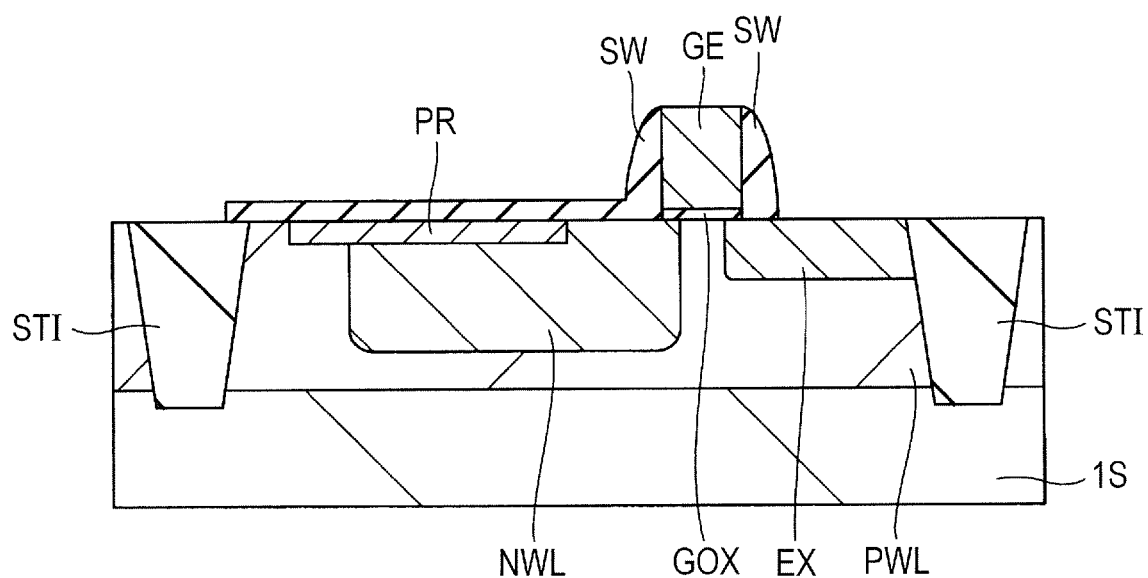
FIG. 16 is a cross-sectional view showing the manufacturing process of the image sensor following FIG. 15.

As shown in FIG. 15, the extension region EX in correspondence with the gate electrode GE is formed according to the photolithography and the ion implantation. Then, as shown in FIG. 16, for example, the insulating film made of a silicon oxide film is formed on the semiconductor substrate 1S covering the gate electrode GE of the transfer transistor, and anisotropy etching is performed on this insulating film. According to this, the sidewall spacer SW can be formed on the both sidewalls of the gate electrode GE of the transfer transistor. Here, etching using a mask is performed to leave the insulating film also in the region with the photoelectric conversion unit formed.

Figure 17:
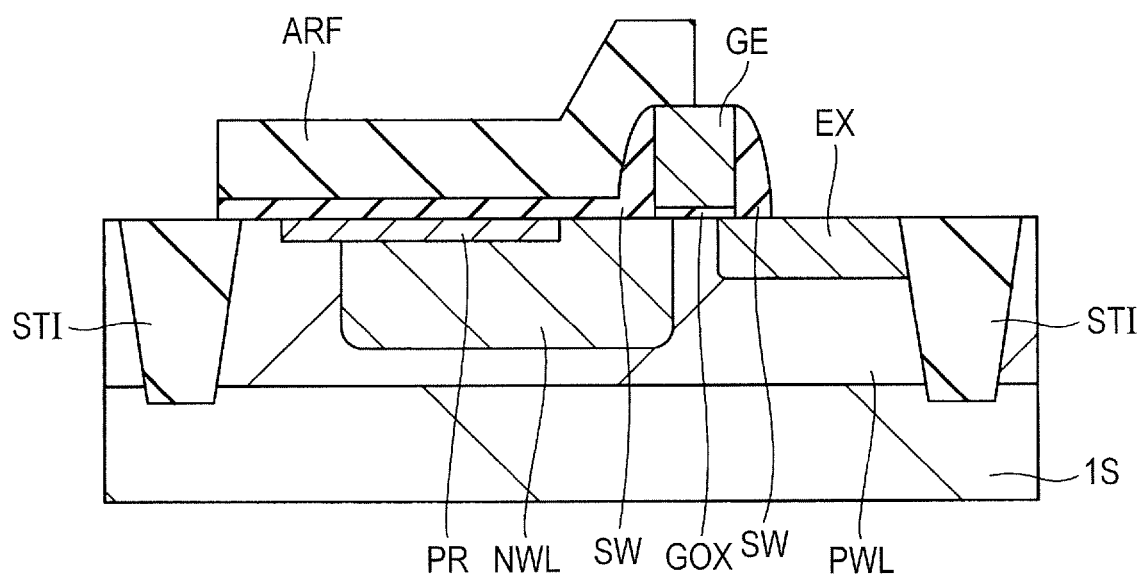
FIG. 17 is a cross-sectional view showing the manufacturing process of the image sensor following FIG. 16.

As shown in FIG. 17, a silicon oxynitride film is formed on the semiconductor substrate 1S, for example, according to the CVD method, and the silicon oxynitride film is patterned according to the photolithography and the etching. According to this, an antireflection film ARF made of the silicon oxynitride film can be formed.

Figure 18:
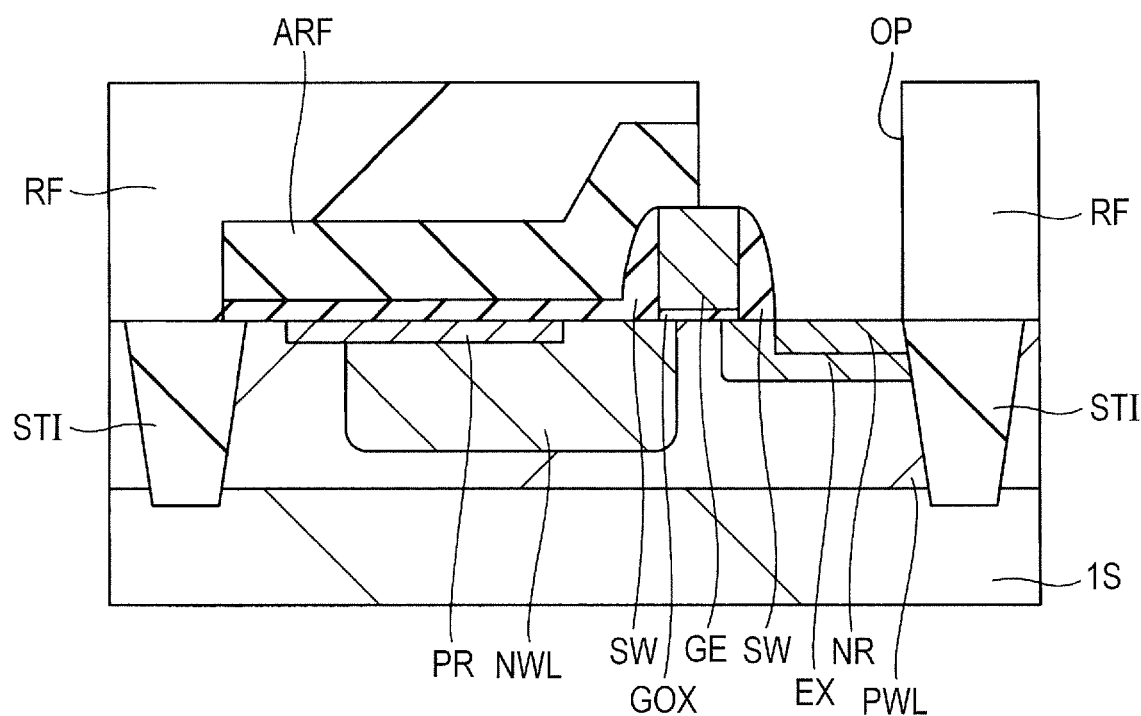
FIG. 18 is a cross-sectional view showing the manufacturing process of the image sensor following FIG. 17.

As shown in FIG. 18, after the resist film RF is applied on the semiconductor substrate 1S, the exposure and development processing is performed on the resist film RF. According to this, the resist film RF can be patterned. The resist film RF is patterned to form an opening portion OP shown in FIG. 18. Specifically, the resist film RF is patterned to expose a half (right half) of the gate electrode GE in a gate length direction and to expose a part of the extension region EX sandwiched by the sidewall spacer SW and the element isolation region STI. Thereafter, as shown in FIG. 18, according to the ion implantation with the patterned resist film RF as a mask, the n-type dopant such as phosphorus (P) or arsenic (As) is introduced into the semiconductor substrate 1S. Thus, the $n^+$-type semiconductor region NR in correspondence with the sidewall spacer SW and accommodated into the extension region EX can be formed.

Figure 19:
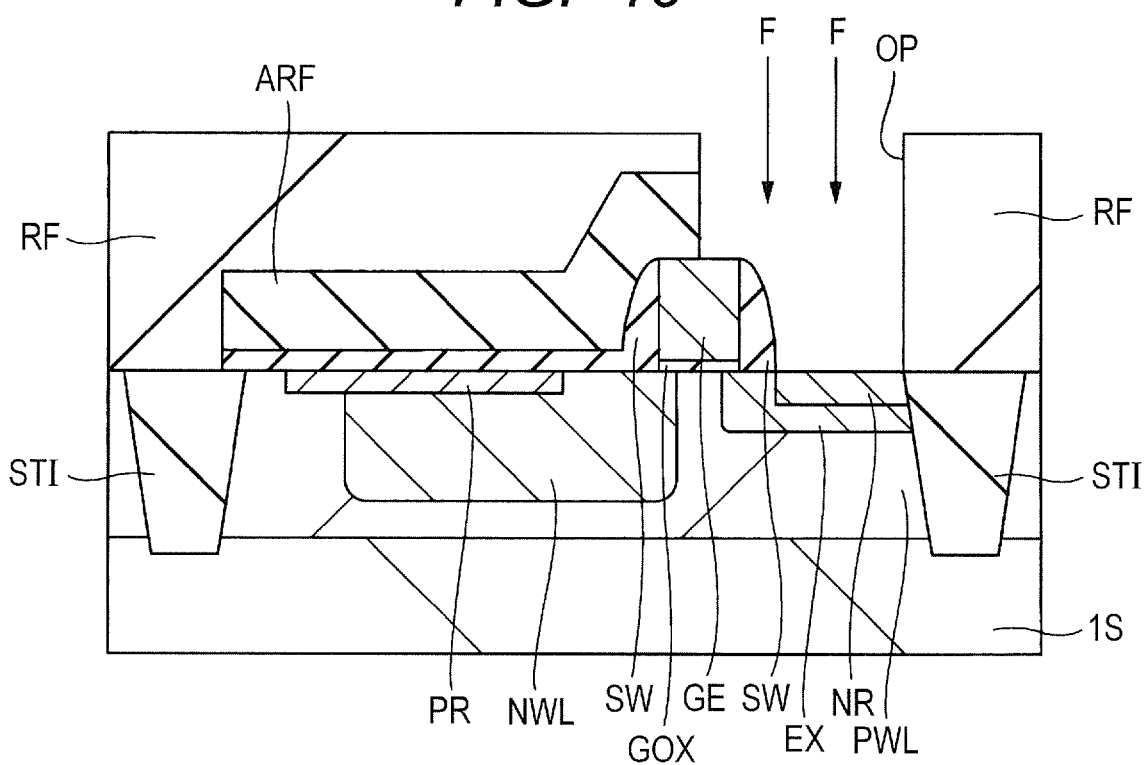
FIG. 19 is a cross-sectional view showing the manufacturing process of the image sensor following FIG. 18.

As shown in FIG. 19, according to the ion implantation using the mask of the opening portion OP formed resist film RF, fluorine is injected into the gate electrode GE bared from the opening portion OP, the sidewall spacer SW bared from the opening portion OP, and the $n^+$-type semiconductor region NR. The injection condition of the fluorine is, for example, the injection energy of 10 keV and the dose amount of $1 \times 10^{15}/cm^2$. According to the embodiment, it is possible to inject the fluorine into a part of the gate electrode GE of the transfer transistor, the sidewall spacer SW at a right side, and the $n^+$-type semiconductor region NR.

After thus introducing the fluorine, thermal processing at 1000° C. is performed on the semiconductor substrate 1S. This activates the introduced dopant. In this thermal processing, the fluorine injected into the gate electrode GE, the sidewall spacer SW, and the $n^+$-type semiconductor region NR is diffused and arrives at the interface with the gate insulating film GOX and the surface of the semiconductor substrate 1S. According to the embodiment, the thermal processing for activating the conductivity type dopant introduced to the source region and drain region of the transfer transistor serves also as the thermal processing for diffusing the fluorine injected into the gate electrode GE, the sidewall spacer SW, and the $n^+$-type semiconductor region NR to the interface with the gate insulating film GOX and the surface of the semiconductor substrate 1S. As the result, the fluorine can be coupled to the dangling bond existing between the silicon (channel region) and the gate insulating film GOX, the dangling bond existing between the sidewall spacer SW and the extension region EX, and the dangling bond existing on the surface of the $n^+$-type semiconductor region NR, according to the above thermal processing in the embodiment. In short, according to the embodiment, the dangling bond existing in the transfer transistor can be reduced. As the result, the interface level of the transfer transistor can be reduced and after all the "dark current" of the image sensor can be reduced.

The photoelectric conversion unit (photodiode) and the transfer transistor in the embodiment can be manufactured as mentioned above. Thereafter, as shown in FIG. 7, the interlayer insulating film IL1 is formed to cover the semiconductor substrate 1S. The interlayer insulating film IL1 is formed of, for example, a silicon oxide film with the TEOS used as the raw material, according to, for example, the plasma CVD method.

In the manufacturing method of the image sensor according to the embodiment, the antireflection film ARF is formed in a step before the process of forming the $n^+$-type semiconductor region NR and the process of introducing the fluorine; however, it is not restricted to this but the antireflection film ARF may be formed after the above processes.

Then, the contact hole is formed in the interlayer insulating film IL1 according to the photolithography and the dry etching. A titanium/titanium nitride film is formed on the interlayer insulating film IL1 including the bottom surface and the inner wall of the contact hole. The titanium/titanium nitride film is formed of a film stack including a titanium film and a titanium nitride film and can be formed, for example, according to the sputtering method. The titanium/titanium nitride film has a so-called barrier property of, for example, avoiding tungsten which is the material embedded in the later process from diffusing to the silicon. Then, the tungsten film is formed on the whole main surface of the semiconductor substrate 1S to fill the contact hole. This tungsten film can be formed, for example, according to the CVD method. Unnecessary titanium/titanium nitride film and the tungsten film formed on the interlayer insulating film IL1 are eliminated, for example, according to the CMP method, hence to form the plug PLG.

For example, as shown in FIG. 7, the interlayer insulating film IL2 is formed on the interlayer insulating film IL1 having the plug PLG formed. A trench is formed in the interlayer insulating film IL2, according to the photolithography and the etching. Thereafter, the tantalum/tantalum nitride film is formed on the interlayer insulating film IL2 including the inward of the trench. The tantalum/tantalum nitride film can be formed, for example, according to the sputtering method. After a seed film made of a thin copper film is formed on the tantalum/tantalum nitride film, for example, according to the sputtering method, a copper film is formed on the interlayer insulating film IL2 having the trench, according to the electrolytic plating with the seed film as the electrode. Then, the copper film bared on the interlayer insulating film IL2 excluding the inward of the trench is polished and eliminated, for example, according to the CMP method, hence to leave the copper film only in the inward of the trench formed in the interlayer insulating film IL2. Thus, the wiring L1 can be formed. Hereinafter, similarly, the wiring L2 is formed in the interlayer insulating film IL3, and the wiring L3 is formed in the interlayer insulating film IL4. Further, a wiring may be formed on the upper layer of the wiring L3; however, its description is omitted here.

Although the embodiment has been described taking an example of forming the wiring L1 made of a copper film, the wiring L1 may be formed of, for example, an aluminum film.

In this case, the titanium/titanium nitride film, the aluminum film, and the titanium/titanium nitride film are sequentially formed on the interlayer insulating film IL1 and the plug PLG. These films are formed, for example, according to the sputtering method. Continuously, these films are patterned according to the photolithography and the etching, to form the wiring L1. According to this, the wiring L1 made of an aluminum film can be formed.

Further, as shown in FIG. 7, the color filter CF is attached to the interlayer insulating film IL4 of the upmost layer in a way of overlapping with the photodiode in plan view and at the end, the microlens OL is arranged on the color filter CF. As mentioned above, the image sensor can be manufactured in the embodiment.

The manufacturing method of the image sensor in the embodiment is summarized as follows. The manufacturing method of the image sensor in the embodiment includes: (a) a process of forming the gate electrode GE of the transfer transistor Q (refer to FIG. 13); (b) a process of introducing fluorine to a part of the gate electrode GE, using a mask with the part of the gate electrode GE opened (refer to FIG. 19); and (c) after the process (b), a process of performing the thermal processing on the semiconductor substrate 1S. The manufacturing method further includes (d) a process of forming the drain region of the transfer transistor Q (refer to FIG. 18), after the process (a) and before the process (b). In the process (b), the fluorine is introduced to a part of the gate electrode GE and the drain region, using a mask for covering the n-type well NWL with the above part of the gate electrode GE and the drain region opened. Particularly, in the process (b), the fluorine is introduced to the gate electrode GE according to the ion implantation. It is preferable that the injection energy of the fluorine in the ion implantation is smaller than the energy necessary for the fluorine to penetrate the gate electrode GE.

In the process (d), using a drain region forming mask, the conductivity type dopant is introduced to the semiconductor substrate 1S, to form the drain region (refer to FIG. 18). Particularly, in the manufacturing method of the image sensor in the embodiment, the mask used in the process (b) is the drain region forming mask (refer to FIGS. 18 and 19).

Further, the thermal processing performed in the process (c) is activation annealing for activating the conductivity type dopant introduced to the semiconductor substrate 1S.

<Characteristics in the Embodiment>

Next, the characteristic points in the embodiment will be described. First characteristic point in the embodiment is that after forming the $n^+$-type semiconductor region NR making a part of the drain region of the transfer transistor, as shown in FIG. 18, fluorine is introduced to a part of the gate electrode GE, the sidewall spacer SW, and the $n^+$-type semiconductor region NR, as shown in FIG. 19, and that the thermal processing is thereafter performed on the semiconductor substrate 1S. Therefore, according to the embodiment, it is possible to couple the fluorine to the dangling bond existing between the silicon (channel region) and the gate insulating film GOX, the dangling bond existing between the sidewall spacer SW and the extension region EX, and the dangling bond existing on the surface of the $n^+$-type semiconductor region NR. In short, according to the process shown in FIG. 19, the fluorine can be introduced to the gate electrode GE, the sidewall spacer SW, and the $n^+$-type semiconductor region NR of the transfer transistor. Then, according to the thermal processing after the above process, the fluorine introduced to the gate electrode GE, the sidewall spacer SW, and the $n^+$-type semiconductor region NR is thermally diffused. According to this, the fluorine can be coupled to the dangling bond existing between the silicon (channel region) and the gate insulating film GOX, the dangling bond existing between the sidewall spacer SW and the extension region EX, and the dangling bond existing on the surface of the $n^+$-type semiconductor region NR. In short, according to the first characteristic point in the embodiment, it is possible to reduce the dangling bond existing in the transfer transistor. Further, according to the first characteristic point in the embodiment, it is possible to reduce the interface level in the transfer transistor and finally reduce the "dark current" in the image sensor.

A second characteristic point in the embodiment is that the patterned mask made of a resist film RF is used in order to introduce the fluorine, for example, as shown in FIG. 19. According to the second characteristic point in the embodiment, it is possible to suppress the fluorine from entering the n-type well NWL forming a part of the photoelectric conversion unit (photodiode), for example, as shown in FIG. 19. In other words, according to the embodiment, since the n-type well NWL forming a part of the photoelectric conversion unit is covered with the patterned mask made of a resist film RF, the fluorine is suppressed from entering the n-type well NWL.

Specifically, when the fluorine is introduced to the n-type well NWL according to the ion implantation, the introduced fluorine generates a defect level within the n-type well NWL. When the defect level is generated, a leak current is increased through the defect level in the photoelectric conversion unit, which may cause an increase in the white spot defects in the dark mode or the dark current. Further, although the ion implantation is used for the introduction of fluorine, there may occur a bad effect caused by the contaminant included in the ion beam (contamination) including the fluorine. The ion beam including the fluorine includes the contaminant, for example, typified by tungsten (W) and also the mixture of a metallic atom typified by the tungsten (W) into the n-type well NWL may cause an increase in the white spot defects in the dark mode or the dark current in the image sensor. When the defect level is generated caused by the introduction of the fluorine itself and the metallic atom as the contaminant to the n-type well NWL, a leak current is increased through the defect level in the photoelectric conversion unit and the increased leak current is considered to cause an increase in the white spot defects in the dark mode or the dark current.

Thus, the introduction of the fluorine is effective in reducing the dangling bond existing between the silicon (channel region) and the gate insulating film GOX, the dangling bond existing between the sidewall spacer SW and the extension region EX, the dangling bond existing on the surface of the $n^+$-type semiconductor region NR. On the other hand, the introduction of the fluorine to the n-type well NWL forming a part of the photoelectric conversion unit causes the defect level and therefore, should be avoided. In the embodiment, the ion implantation of the fluorine is performed with the mask covering the n-type well NWL forming a part of the photoelectric conversion unit. According to this, the embodiment can introduce the fluorine to the gate electrode GE, the sidewall spacer SW, and the $n^+$-type semiconductor region NR of the transfer transistor while suppressing the introduction thereof to the n-type well NWL. Specifically, in performing the first characteristic point of the embodiment, the second characteristic point is adopted to suppress the occurrence of the defect level in the n-type well NWL, as well as to reduce the interface level between the silicon (channel region) and the gate insulating film GOX, the interface level between the sidewall spacer SW and the extension region EX, and the interface level on the surface of the $n^+$-type semiconductor region NR. As the result, the image sensor according to the embodiment can effectively reduce the "dark current".

Particularly, the embodiment suppresses the introduction of the fluorine to the n-type well NWL. Specifically, as shown in FIG. 19, the whole gate electrode GE is not bared but the mask (patterned resist film RF) with the opening portion for baring a part (for example, a half) of the gate electrode GE formed there is used. This is because of preventing an unintentional introduction of the fluorine to the n-type well NWL, caused by the positional deviation (forming deviation) of the mask. When using a mask of opening the whole gate electrode GE, there is a fear that the fluorine may be introduced into the n-type well NWL only with a little positional deviation of the mask. On the contrary, as shown in FIG. 19, when using the mask of baring a part of the gate electrode GE and covering the other part of the gate electrode GE, the n-type well NWL can be avoided from being bared from the opening portion OP even if a positional deviation (forming deviation) occurs in the mask; therefore, the unintentional introduction of the fluorine to the n-type well NWL can be effectively suppressed. According to the embodiment, even when a positional deviation of the mask occurs in the actual manufacturing process, a margin for the positional deviation can be fully secured, hence to be able to avoid the unintentional introduction of the fluorine into the n-type well NWL assuredly.

In the embodiment, the unintentional introduction of the fluorine to the n-type well NWL can be suppressed also by the first characteristic point such that after forming the $n^+$-type semiconductor region NR forming a part of the drain region of the transfer transistor, the fluorine is introduced to a part of the gate electrode GE, the sidewall spacer SW, and the $n^+$-type semiconductor region NR. This is because, when adopting the first characteristic point, for example, as shown in FIG. 19, the antireflection film ARF has been already formed in an overlapping region with the n-type well NWL in plan view and the resist film RF is formed on the antireflection film ARF. In other words, in the embodiment, in the introduction of the fluorine, not only the resist film RF but also the antireflection film ARF is formed on the n-type well NWL and it is hard for the fluorine to penetrate there. In the embodiment, the fluorine has to penetrate not only the resist film RF but also the antireflection film ARF in order to arrive at the n-type well NWL; as the result, the introduction of the fluorine to the n-type well NWL is suppressed as much. Even when a large positional deviation occurs in the mask, the antireflection film ARF suppresses the n-type well NWL from being bared, hence to suppress the introduction of the fluorine to the n-type well NWL assuredly.

As mentioned above, according to the first characteristic point and the second characteristic point in the embodiment, the "dark current" inevitably existing in the image sensor can be effectively reduced through the above mentioned improvement for the positional deviation of the mask.

Next, as a third characteristic point in the embodiment, for example, as shown in FIGS. 18 and 19, the mask for forming the $n^+$-type semiconductor region NR forming a part of the drain region of the transfer transistor is used to introduce the fluorine. According to this, without necessity of adding a mask used only for introducing the fluorine, it is possible to reduce the interface level between the channel region and the gate insulating film GOX, the interface level between the sidewall spacer SW and the extension region EX, and the interface level on the surface of the $n^+$-type semiconductor region NR, while suppressing the occurrence of the defect level in the n-type well NWL. As the result, the embodiment can effectively reduce the "dark current" inevitably existing in the image sensor while suppressing an increase in the manufacturing cost.

The technical idea in the embodiment is not restricted to the structure of introducing the fluorine, using the mask for forming the $n^+$-type semiconductor region NR, but, for example, a structure of adding the mask used only for introducing the fluorine may be adopted. Also in this case, the "dark current" inevitably existing in the image sensor can be effectively reduced.

As the other constitutional elements, the semiconductor chip with the constitutional elements shown in FIG. 8 formed there includes an input/output circuit (I/O circuit) for realizing exchange of signals with the outward. The input/output circuit is formed by a field-effect transistor, and the drain region of the transfer transistor and the drain region of the field-effect transistor forming the input/output circuit may be formed in the same ion implantation process. In this case, as the mask used for the ion implantation, a mask with both the drain regions of the transfer transistor and the field-effect transistor opened is used. Therefore, it is impossible to introduce the fluorine only to the transfer transistor, using this mask, after forming the drain regions. When forming the drain region of the transfer transistor and the drain region of the field-effect transistor forming the input/output circuit in the same ion implantation process, a mask exclusive use for introducing the fluorine only to the transfer transistor is required.

In the special case, the drain region of the transfer transistor and the drain region of the field-effect transistor forming the input/output circuit are separately formed in the individual ion implantation processes. Specifically, the dopant concentration in the drain region of the transfer transistor is made smaller than that in the drain region of the field-effect transistor forming the input/output circuit. Because the drain region (floating diffusion area) of the transfer transistor Q is electrically coupled to the gate electrode of the amplifier transistor ATr, for example, as shown in FIG. 8. When turning on the transfer transistor Q, electric charges flow from the photoelectric conversion unit to the drain region of the transfer transistor Q, and the potential based on the electric charges are applied to the gate electrode of the amplifier transistor ATr. Therefore, it is desirable that even a smaller electric charge increase the potential (gate voltage) applied to the gate electrode of the amplifier transistor ATr, from the viewpoint of improving the sensibility of the image sensor. Because, for example, in the case of applying the threshold voltage to the gate electrode of the amplifier transistor ATr with the electric charge amount "10", the sensibility is to be improved ten times more than in the case of doing the same with the electric charge amount "100".

According to the relation of the electric charge amount=electrostatic capacity (C)×voltage (V), it is found that the electrostatic capacity (C) should be preferably as small as possible in order to increase the voltage (here, the gate voltage applied to the gate electrode of the amplifier transistor ATr) as much as possible with the same electric charge amount. Since the electrostatic capacity is mainly a junction capacity in the drain region of the transfer transistor Q, the dopant concentration in the drain region of the transfer transistor is diminished in order to decrease the junction capacity. In other words, when the dopant concentration in the drain region of the transfer transistor Q is reduced, the junction capacity is reduced as the result of increasing the width of the depletion layer in the pn junction. As mentioned above, from the viewpoint of improving the sensibility of the image sensor, the dopant concentration in the drain region of the transfer transistor Q is made smaller than that in the drain region of the field-effect transistor forming the input/output circuit. In this case, the mask only used for forming the drain region of the transfer transistor Q has the opening portion only corresponding to the drain region of the transfer transistor. After forming the drain region ($n^+$-type semiconductor region NR) of the transfer transistor, this mask is used as it is, hence to do the introduction process of the fluorine to the transfer transistor. When the dopant concentration in the drain region of the transfer transistor Q is made smaller than that in the drain region of the field-effect transistor forming the input/output circuit, from the viewpoint of improving the sensibility of the image sensor, the fluorine can be introduced only to the transfer transistor Q by using the mask for forming the $n^+$-type semiconductor region NR forming a part of the drain region of the transfer transistor Q.

<Advantage Over Related Art>

Continuously, an advantage over the related art according to the technical idea in the embodiment will be described.

For example, as shown in FIG. 12, after forming the polysilicon film PF, a related art such as introducing the fluorine to the polysilicon film PF can be considered by using the ion implantation. In this case, as shown in FIG. 13, the fluorine-introduced polysilicon film PF is patterned, to form the fluorine-introduced gate electrode GE. After forming the gate electrode GE, the thermal processing is performed on the semiconductor substrate 1S, so that the fluorine introduced to the gate electrode GE can be diffused to the interface between the gate electrode GE and the gate insulating film GOX. As the result, the fluorine can be coupled to the dangling bond existing in the interface between the gate electrode GE and the gate insulating film GOX, hence to reduce the occurrence of the interface level caused by the dangling bond. Accordingly, also in the related art, it is considered that the increase of the "dark current" caused by the interface level can be suppressed.

The technical idea in the embodiment, however, has an advantage over the above mentioned related art, which will be hereinafter described. At first, in the related art, the fluorine is introduced to the whole surface of the polysilicon film PF shown in FIG. 12. In this case, for example, the fluorine is introduced also into the semiconductor substrate 1S having the photoelectric conversion unit formed there. The injection of the fluorine generates a defect level in the photoelectric conversion unit. As the result, in the related art, although the interface level caused by the dangling bond can be reduced by coupling the fluorine to the dangling bond existing in the transfer transistor, a defect level is generated in the photoelectric conversion unit, which increases a leak current through the defect level, resulting in increasing the white spot defects in the dark mode or the dark current. In the related art, it becomes difficult to reduce the interface level while suppressing the occurrence of the defect level, and to reduce the "dark current" effectively in the image sensor.

In the related art, it is considered that the fluorine is introduced with such injection energy as not to penetrate the polysilicon film PF. In this case, the fluorine rarely penetrates the polysilicon film PF and is unlikely introduced to the photoelectric conversion unit covered with the polysilicon film PF. After introducing the fluorine to the polysilicon film PF, however, the thermal processing is performed to diffuse the fluorine. Here, the fluorine introduced to the polysilicon film PF becomes easy to arrive at the photoelectric conversion unit covered with the polysilicon film PF. Further, in the ion implantation of the fluorine, metallic atoms such as tungsten are introduced as the contaminant. As the result, in the related art, even if the fluorine is introduced with such the injection energy as not to penetrate the polysilicon film PF, a defect level easily occurs in the photoelectric conversion unit. In the related art, the defect level occurring in the photoelectric conversion unit increases a leak current through the defect level, which makes it difficult to effectively suppress the increase in the white spot defects in the dark mode or the dark current.

On the contrary, according to the technical idea in the embodiment, the mask for covering the photoelectric conversion unit is used and the fluorine is introduced to the transfer transistor. As the result, according to the embodiment, the fluorine can be introduced to the gate electrode GE, the sidewall spacer SW, and the $n^+$-type semiconductor region NR of the transfer transistor while suppressing its introduction to the n-type well NWL. In other words, according to the technical idea in the embodiment, the interface level can be reduced in the transfer transistor while suppressing the occurrence of the defect level in the n-type well NWL. In short, the image sensor in the embodiment can reduce the "dark current" effectively. The technical idea such as introducing the fluorine to the transfer transistor, using the mask for covering the photoelectric conversion unit, is significant for both the reduction of the interface level caused by the dangling bond and the suppression of the occurrence of the defect level in the photoelectric conversion unit. This significant point in the technical idea of the embodiment has an advantage over the related art.

In the related art, since the fluorine is introduced after forming the polysilicon film PF, many thermal processes are performed after the introduction of the fluorine. Specifically, there are, for example, the activation process of the n-type dopant introduced into the n-type well NWL in FIG. 14, the activation process of the p-type dopant introduced into the $p^+$-type semiconductor region PR, the process of forming the sidewall spacer SW shown in FIG. 16, the process of forming the antireflection film ARF in FIG. 17, and the activation process of the n-type dopant introduced into the $n^+$-type semiconductor region NR. As the result of performing lots of thermal processes after the introduction of the fluorine to the polysilicon film PF, in the related art, the fluorine is easily diffused somewhere other than the interface between the polysilicon film PF and the gate insulating film GOX. This means to reduce a probability of coupling the fluorine to the dangling bond existing in the interface between the polysilicon film PF and the gate insulating film GOX. In the related art, after the introduction of the fluorine, there are many thermal processes, and therefore, the thermal diffusion of the fluorine occurs more than necessity and the fluorine to be coupled to the dangling bond is decreased. As the result, in the related art, the reduction effect of the interface level caused by coupling the fluorine to the dangling bond is diminished. Further, in the related art, since the thermal processes more than necessity exist after the introduction of the fluorine, a probability that the fluorine arrives at the photoelectric conversion unit is increased, and according to this, also the occurrence of the defect level in the photoelectric conversion unit may be increased disadvantageously. In short, in the related art, because of the existence of many thermal processes after the introduction of the fluorine, the fluorine to be coupled to the dangling bond is reduced and the fluorine is easily diffused to the photoelectric conversion unit. Therefore, in the related art, even if introducing the fluorine, it is hard to reduce the "dark current" caused by the interface level and the defect level.

On the contrary, according to the technical idea in the embodiment, after forming the $n^+$-type semiconductor region NR forming a part of the drain region of the transfer transistor, the fluorine is introduced to the transfer transistor, and then, the thermal processing is performed on the semiconductor substrate 1S. According to the embodiment, the thermal processes performed after the introduction of the fluorine can be decreased compared to the related art. This means to reduce the fluorine diffused outward without being coupled to the dangling bond and to effectively suppress the fluorine diffusion to the photoelectric conversion unit. In short, the technical idea in the embodiment can reduce the "dark current" thanks to the reduced interface level and the reduced occurrence of the defect level. As mentioned above, the technical idea such as introducing the fluorine to a part of the gate electrode GE, the sidewall spacer SW, and the $n^+$-type semiconductor region NR, after forming the $n^+$-type semiconductor region NR forming a part of the drain region of the transfer transistor is significant for both the reduction of the interface level caused by the dangling bond and the suppression of the occurrence of the defect level in the photoelectric conversion unit. This significant point in the technical idea of the embodiment has an advantage over the related art.

Further, in the related art, the fluorine is not introduced to the drain region of the transfer transistor. Therefore, the related art has no effect of reducing the interface level in the drain region. Furthermore, the related art has no countermeasure against the generated interface level caused by an etching damage in patterning the gate electrode GE and is less effective in reducing the "dark current" by reducing the interface level.

On the contrary, according to the technical idea in the embodiment, after forming the $n^+$-type semiconductor region NR forming a part of the drain region of the transfer transistor, the fluorine is introduced to the transfer transistor, and then, the thermal processing is performed on the semiconductor substrate 1S. Accordingly, the fluorine is introduced not only to the gate electrode of the transfer transistor but also to the drain region. As the result, the technical idea in the embodiment can reduce the interface level between the channel region and the gate insulating film GOX, the interface level between the sidewall spacer SW and the extension region EX, and the interface level on the surface of the $n^+$-type semiconductor region NR. The above idea can reduce the interface level all over the wide range of the transfer transistor, and therefore, is very significant for reducing the "dark current" by reducing the interface level existing in the transfer transistor. This significant point in the technical idea of the embodiment has an advantage over the related art.

Here, the etching damage in patterning the gate electrode GE is not only on the surface of the semiconductor substrate 1S on the side of the drain region but added to the surface of the semiconductor substrate 1S on the side of the photoelectric conversion unit. The etching damage added to the surface of the semiconductor substrate 1S on the side of the photoelectric conversion unit can be solved according to the ion implantation performed in the later process of forming the $p^+$-type semiconductor region PR. In the process of forming the sidewall spacer SW, the surface of the semiconductor substrate 1S on the side of the photoelectric conversion unit is not etched; therefore, no etching damage occurs on the surface of the semiconductor substrate 1S on the side of the photoelectric conversion unit. Thus, it is important to cope with the interface level caused by the etching damage added to the surface of the semiconductor substrate 1S on the side of the drain region.

With respect to this point, according to the technical idea in the embodiment, the fluorine is introduced not only to the gate electrode of the transfer transistor but also to the drain region thereof. As the result, according to the same technical idea, countermeasures are fully taken against the generated interface level caused by the etching damage added to the surface of the semiconductor substrate 1S on the side of the drain region. The technical idea in the embodiment has a great advantage over the related art having no countermeasures against the above generated interface level.

<Availability of Fluorine Introduction Technique in the Embodiment>

Continuously, availability of the fluorine introduction technique in the embodiment will be described. For example, in FIG. 9, the transfer transistor Q uses the n-type well NWL forming a part of the photoelectric conversion unit as the source region. As shown in FIG. 9, the n-type well NWL and the gate electrode GE of the transfer transistor Q have an overlapping region in cross sectional view. Here, the inventors et al. have found that, of the interface level formed in the transfer transistor Q, particularly the interface level existing in the interface between the gate insulating film GOX and the channel region becomes a main cause of the increasing "dark current". Specifically, in FIG. 9, the quantity of the "dark current" greatly depends on the interface level existing in the overlapping region of the n-type well NWL and the gate electrode GE. Based on the founding, according as the "L" indicating the width of the above overlapping region gets larger, in FIG. 9, the "dark current" is more increased. It is preferable that this "L" indicating the width of the above overlapping region should be as small as possible, from the viewpoint of reducing the "dark current". On the other hand, when the "L" gets smaller, the transfer efficiency of the electric charges at a time of turning on the transfer transistor Q is deteriorated. From the viewpoint of improving the transfer efficiency of the electric charges in the transfer transistor Q, it is preferable that the "L" indicating the width of the overlapping region of the n-type well NWL and the gate electrode GE should be enlarged. With respect to the adjustment of the above "L", the reduction of the "dark current" and the improvement of the transfer efficiency of the electric charges are mutually in a tradeoff relationship. The technique of reducing the "dark current" by adjusting the above "L" has a side effect of deteriorating the transfer efficiency of the electric charges.

With respect to this point, according to the technical idea in the embodiment, the fluorine is introduced to the transfer transistor Q, to be coupled to the dangling bond, thereby suppressing an increase in the "dark current" caused by the interface level. This technical idea does not deteriorate the transfer efficiency of the electric charges in the transfer transistor Q. In other words, according to the technical idea in the embodiment, without considering the reduction of the "dark current", the "L" indicating the width of the overlapping region of the n-type well NWL and the gate electrode GE transfer transistor Q can be determined from the viewpoint of improving the transfer efficiency of the electric charges. Therefore, it is found that the above technical idea has a good availability in terms of reducing the "dark current" without deteriorating the transfer efficiency of the electric charges in the transistor Q. In short, the technical idea in the embodiment has a good availability in tams of reducing the "dark current" and improving the transfer efficiency of the electric charges in the transfer transistor Q which attributes the improvement of the sensibility of the image sensor.

Modified Example 1

The embodiment has been described taking an example of introducing the fluorine to the transfer transistor after forming the n⁺-type semiconductor region NR forming a part of the drain region of the transfer transistor. The technical idea in the embodiment is not restricted to this, but, for example, after forming the extension region EX forming a part of the drain region of the transfer transistor, the fluorine may be introduced. Also in this case, as the result of reducing the interface level caused by the dangling bond, the "dark current" of the image sensor can be reduced.

Modified Example 2

The embodiment has been described taking an example of introducing the fluorine to both the gate electrode and the drain region of the transfer transistor. However, based on the founding that the quantity of the "dark current" greatly depends on the interface level existing in the overlapping region of the n-type well NWL and the gate electrode GE, as mentioned above, if only introducing the fluorine at least to the gate electrode, the "dark current" can be reduced in the image sensor.

<Actualization into Image Sensor as Final Product>

In the embodiment, after introducing the fluorine to both the gate electrode and the drain region of the transfer transistor, the thermal processing is performed on the semiconductor substrate. According to this, the embodiment can obtain a remarkable effect of reducing the "dark current" caused by the interface level in the image sensor as the final product, as the result of reducing the interface level in the transfer transistor. Therefore, in the image sensor as the final product in the embodiment, the fluorine is introduced to the gate electrode and the drain region of the transfer transistor. Here, in the transfer transistor, the fluorine exists in the interface between the channel region and the gate insulating film. On the other hand, no fluorine is introduced to the photoelectric conversion unit in the image sensor according to the embodiment.

As mentioned above, the technical idea in the embodiment can be realized by the image sensor as the final product in which the fluorine is introduced to the gate electrode and the drain region of the transfer transistor. In the image sensor as the final product realizing the technical idea in the embodiment, performance typified by the sensibility can be much more improved by reducing the "dark current", compared with the conventional image sensor.

As set forth hereinabove, although the invention made by the inventors et al. has been described concretely based on the embodiment, the invention is not restricted to this embodiment but it is needless to say that various modifications can be made without departing from its spirit.

What is claimed is:

1. A solid-state imaging device, comprising:
a semiconductor substrate including an imaging region with a plurality of pixels formed therein,
the imaging region including:
a photoelectric conversion unit for converting incident light into electric charge; and
a transfer transistor for transferring the electric charge;
the transfer transistor including:
a source region and a drain region formed mutually at a distance within the semiconductor substrate;
a channel region sandwiched between the source region and the drain region;
a gate insulating film formed on the channel region; and
a first gate electrode formed on the gate insulating film,
wherein fluorine is included in the drain region and only a drain region side portion of the first gate electrode.

2. The solid-state imaging device according to claim 1, wherein fluorine exists in an interface between the channel region and the gate insulating film.

3. The solid-state imaging device according to claim 1, wherein fluorine is not introduced to the photoelectric conversion unit.

4. The solid-state imaging device according to claim 1, wherein the photoelectric conversion unit includes a second semiconductor region of a second conductivity type opposite to a first conductivity type, which is accommodated into a first semiconductor region of the first conductivity type in plan view.

5. The solid-state imaging device according to claim 4, wherein the second semiconductor region is the source region of the transfer transistor.

6. The solid-state imaging device according to claim 5, wherein the second semiconductor region has an overlapping region with the first gate electrode in plan view.

7. The solid-state imaging device according to claim 4, wherein a third semiconductor region of the first conductivity type having a higher dopant concentration than the first semiconductor region is formed on a surface of the second semiconductor region.

8. The solid-state imaging device according to claim 7, wherein the third semiconductor region is at a distance from the first gate electrode.

9. The solid-state imaging device according to claim 1, further comprising:
an amplifier transistor for amplifying an electric signal based on the electric charge,
wherein the drain region of the transfer transistor is electrically coupled to a second gate electrode of the amplifier transistor.

10. The solid-state imaging device according to claim 1, wherein the semiconductor substrate is a silicon substrate, and
wherein the gate insulating film is a silicon oxide film.

* * * * *